| (12) | United States Patent | (10) Patent No.: US 10,644,650 B2 |
|---|---|---|
| | Chamas | (45) Date of Patent: May 5, 2020 |

(54) AMPLIFIER CONFIGURATION FOR LOAD-LINE ENHANCEMENT

(71) Applicant: Qualcomm Incorporated, San Diego, CA (US)

(72) Inventor: Ibrahim Ramez Chamas, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/138,811

(22) Filed: Sep. 21, 2018

(65) Prior Publication Data

US 2019/0097583 A1    Mar. 28, 2019

Related U.S. Application Data

(60) Provisional application No. 62/562,343, filed on Sep. 22, 2017.

(51) Int. Cl.
*H03F 3/45* (2006.01)
*H03F 1/02* (2006.01)
*H03F 3/213* (2006.01)

(52) U.S. Cl.
CPC ......... *H03F 1/0211* (2013.01); *H03F 1/0261* (2013.01); *H03F 3/213* (2013.01); *H03F 3/45188* (2013.01); *H03F 3/45215* (2013.01); *H03F 3/45242* (2013.01); *H03F 2200/267* (2013.01); *H03F 2200/387* (2013.01); *H03F 2200/507* (2013.01); *H03F 2203/45022* (2013.01); *H03F 2203/45156* (2013.01); *H03F 2203/45316* (2013.01); *H03F 2203/45374* (2013.01); *H03F 2203/45396* (2013.01); *H03F 2203/45638* (2013.01); *H03F 2203/45731* (2013.01)

(58) Field of Classification Search
CPC ................................ H03F 3/45; H03F 1/0211
USPC ........................................ 330/252, 253, 297
See application file for complete search history.

(56) References Cited

U.S. PATENT DOCUMENTS 6,100,717 A    8/2000  May
7,449,950 B2  11/2008  Ivanov
(Continued)

OTHER PUBLICATIONS

Yuan-Hung Chung et al. "Dual-Band Integrated Wi-Fi PAs with Load-Line Adjustment and Phase Compensated Power Detector", MediaTek Inc., Hsinchu, Taiwan, 30078. R.O.C., 2015 pp. 223-228.

*Primary Examiner* — Steven J Mottola
(74) *Attorney, Agent, or Firm* — Holland & Hart LLP/Qualcomm Incorporated

(57) ABSTRACT

Amplifier configuration for load-line enhancement is described herein. In some implementations, an apparatus includes an amplifier. The amplifier includes at least one plus transistor stack, at least one minus transistor stack, and at least one inductor. The at least one plus transistor stack is coupled to a plus amplifier node and a plus input node. The at least one minus transistor stack is coupled to a minus amplifier node and a minus input node. The at least one inductor is coupled between the plus amplifier node and the minus amplifier node, with the at least one inductor including an inter-inductor node. The amplifier also includes a minus power switch coupled between the minus amplifier node and one or more supply voltages and an inductor power switch coupled between the inter-inductor node and at least one supply voltage.

29 Claims, 15 Drawing Sheets

(56) References Cited

U.S. PATENT DOCUMENTS

| | | | |
|---|---|---|---|
| 7,978,009 B2 | 7/2011 | Mu | |
| 8,570,106 B2 * | 10/2013 | Kim | H03F 1/223 330/260 |
| 9,584,076 B2 | 2/2017 | Ortiz | |
| 10,141,891 B2 * | 11/2018 | Gomez | H03G 3/3042 |
| 2015/0357977 A1 * | 12/2015 | Bonaccio | H03B 5/10 331/117 FE |
| 2017/0012653 A1 | 1/2017 | Fong et al. | |

* cited by examiner

1200

Provide, with a voltage supply, a voltage supply signal to a differential amplifier, the differential amplifier including a first pair of transistors designed for a load line having a first impedance in a first amplifier configuration
1202

Configure, with amplifier configuration circuitry, the differential amplifier in a second amplifier configuration corresponding to the load line having a second impedance, the second impedance lower than the first impedance
1204

Disable, with the amplifier configuration circuitry, one transistor of the first pair of transistors
1206

Enable, with the amplifier configuration circuitry, at least one transistor of a second pair of transistors of the differential amplifier, the second pair of transistors being a complementary transistor type to the first pair of transistors, an enabled transistor of the second pair of transistors having a first terminal coupled to the voltage supply signal and a second terminal coupled to a first terminal of an additional transistor of the first pair of transistors
1208

Amplify, with the with the differential amplifier, an input signal with the differential amplifier in the second amplifier configuration with the load line having the first impedance
1210

```
┌─────────────────────────────────────────────────────┐
│ Configure an inductor power switch that selectively │
│ couples an inter-inductor node of at least one      │
│ inductor to a supply voltage                         │
│                     1402                             │
└─────────────────────────────────────────────────────┘
                          ↓
┌─────────────────────────────────────────────────────┐
│ Configure a power switch that selectively couples    │
│ at least one amplifier node to another supply       │
│ voltage, with the at least one amplifier node       │
│ disposed between the at least one inductor and at   │
│ least one amplifier transistor                       │
│                     1404                             │
└─────────────────────────────────────────────────────┘
                          ↓
┌─────────────────────────────────────────────────────┐
│ Operate an amplifier in a first amplifier            │
│ configuration in which the inductor power switch    │
│ connects the inter-inductor node to the supply      │
│ voltage having a second supply voltage level and    │
│ the power switch is disconnected from the other     │
│ supply voltage                                        │
│                     1406                             │
└─────────────────────────────────────────────────────┘
                          ↓
┌─────────────────────────────────────────────────────┐
│ Operate the amplifier in a second amplifier          │
│ configuration in which the inductor power switch    │
│ is disconnected from the supply voltage and the     │
│ power switch connects the at least one amplifier    │
│ node to the other supply voltage having the second  │
│ supply voltage level                                 │
│                     1408                             │
└─────────────────────────────────────────────────────┘
```

FIG. 14

AMPLIFIER CONFIGURATION FOR LOAD-LINE ENHANCEMENT

CROSS-REFERENCE TO RELATED APPLICATION

This application claims the benefit of U.S. Provisional Application No. 62/562,343, filed 22 Sep. 2017, the disclosure of which is hereby incorporated by reference in its entirety herein.

TECHNICAL FIELD

The present disclosure relates to signal usage with electronic devices and, more specifically, to managing the power consumption of an amplifier that can amplify a signal (e.g., for transmission from an electronic device) using amplifier reconfiguration.

BACKGROUND

Electronic devices include traditional computing devices such as desktop computers, notebook computers, smartphones, wearable devices like a smartwatch, internet servers, and so forth. However, electronic devices also include other types of computing devices such as personal voice assistants, thermostats, automotive electronics, robotics, devices embedded in other machines like refrigerators and industrial tools, medical devices, Internet of Things (IoT) devices, and so forth. These various electronic devices provide services relating to productivity, remote communication, social interaction, security, health and safety, entertainment, transportation, and information dissemination. Thus, electronic devices play crucial roles in many aspects of modern society.

Many of the services provided by electronic devices in today's interconnected world depend at least partly on electronic communications. Electronic communications include, for example, those exchanged between or among different electronic devices using wireless or wired signals that are transmitted over one or more networks, such as the Internet or a cellular network. Electronic communications therefore include both wireless and wired transmissions and receptions. With wireless electronic communications, mobile services can be enjoyed by users of electronic devices. With a smart phone, for example, mobile services can include voice and video calls, social media interactions, messaging, watching movies, sharing videos, performing searches, acquiring map information or navigational instructions, locating friends, transferring money, making reservations or purchasing tickets, obtaining another service like a car ride, monitoring health data, and so forth.

To participate in a wireless electronic communication, an electronic device uses a wireless communication component, such as a wireless transceiver. Electronic communications can therefore be realized by propagating signals between two wireless transceivers at two different electronic devices. For example, using a wireless transmitter, a smart phone can transmit a wireless signal to a base station over an air medium as part of an uplink communication to support mobile services. Using a wireless receiver, the smart phone can receive a wireless signal from the base station via the air medium as part of a downlink communication to enable mobile services. Wireless transceivers, however, consume power, which is limited with a portable or other battery-powered device.

Battery-powered talk-time represents how long a device can, on average, engage in a voice conversation before a battery's energy reserves are depleted. Thus, a longer talk-time is better than a shorter talk-time, and many device manufacturers advertise the rated talk-time of each electronic device. One aspect of a wireless transceiver that consumes power during operation—for both voice calls and other wireless communications—is the amplifier. Amplifiers are used to increase a signal's strength, or amplitude, in many electronic devices. For instance, transmitters in mobile phones may include driver amplifiers and power amplifiers that supply a signal to an antenna during transmission operations and may include low-noise amplifiers (LNAs) that accept a received signal from the antenna during reception operations.

During times of wireless transceiver activity, amplifiers draw an appreciable level of power. This power draw can more quickly deplete the energy contained in a battery of a portable or other battery-powered device. Consequently, electrical engineers and other designers of electronic devices strive to develop amplifiers for wireless transceivers that use less power and that can therefore extend talk-time usage, as well as battery life in general.

SUMMARY

This summary is provided to introduce a selection of concepts in a simplified form that are further described below in the detailed description. This summary is not intended to identify key features or essential features of the claimed subject matter.

Various aspects of amplifier configuration for load-line enhancement are disclosed herein. In example aspects, an apparatus including an amplifier is described. The amplifier includes at least one plus transistor stack, at least one minus transistor stack, and at least one inductor. The at least one plus transistor stack is coupled to a plus amplifier node and a plus input node. The at least one minus transistor stack is coupled to a minus amplifier node and a minus input node. The at least one inductor is coupled between the plus amplifier node and the minus amplifier node, with the at least one inductor including an inter-inductor node. The amplifier also includes a minus power switch coupled between the minus amplifier node and one or more supply voltages and an inductor power switch coupled between the inter-inductor node and at least one supply voltage.

In example aspects, a system for load-line enhancement using amplifier reconfiguration is described. The system includes an amplifier, and the amplifier includes a plus array of transistors, a minus array of transistors, and at least one inductor. The plus array of transistors is coupled to a plus amplifier node and a plus input node, with the plus array of transistors including multiple plus transistor stacks. The minus array of transistors is coupled to a minus amplifier node and a minus input node, with the minus array of transistors including multiple minus transistor stacks. The at least one inductor is coupled between the plus amplifier node and the minus amplifier node, with the at least one inductor including an inter-inductor node. The amplifier also includes configuration means for configuring the amplifier into different amplifier configurations. The system also includes control means for controlling the configuration means to adjust an effective impedance of a load line of the amplifier, the control means coupled to the configuration means.

In example aspects, a method is described for amplifier configuration for load-line enhancement. The method includes configuring an inductor power switch that selectively couples an inter-inductor node of at least one inductor to a supply voltage. The method also includes configuring a power switch that selectively couples at least one amplifier node to another supply voltage, with the at least one amplifier node disposed between the at least one inductor and at least one amplifier transistor. The method additionally includes operating an amplifier in a first amplifier configuration in which the inductor power switch connects the inter-inductor node to the supply voltage having a second supply voltage level and the power switch is disconnected from the other supply voltage. The method further includes operating the amplifier in a second amplifier configuration in which the inductor power switch is disconnected from the supply voltage and the power switch connects the at least one amplifier node to the other supply voltage having the second supply voltage level.

In example aspects, an apparatus including a differential amplifier is described. The differential amplifier includes a pair of input transistors and a pair of amplifier transistors. The pair of input transistors is coupled to an equipotential node, with the pair of input transistors configured to receive a differential input signal. The pair of amplifier transistors is respectively coupled in series with the pair of input transistors. The pair of amplifier transistors is configured to amplify the differential input signal. The pair of amplifier transistors have a load line with a first impedance in conjunction with the pair of input transistors in accordance with a first amplifier configuration. The differential amplifier also includes amplifier configuration circuitry coupled to the pair of amplifier transistors. The differential amplifier further includes amplifier configuration control circuitry coupled to the amplifier configuration circuitry. The amplifier configuration control circuitry is configured to use the amplifier configuration circuitry to institute one or more other amplifier configurations that respectively correspond to the load line of the pair of amplifier transistors having one or more other impedances by reconfiguring current flow in the differential amplifier.

In other example aspects, a method of operating a differential amplifier is described. The method includes providing a voltage supply signal to the differential amplifier, the differential amplifier including a first pair of transistors designed for a load line having a first impedance in a first amplifier configuration. The method also includes configuring the differential amplifier in a second amplifier configuration corresponding to the load line having a second impedance that is less than the first impedance. Here, the configuring includes at least one of: disabling one transistor of the first pair of transistors or enabling at least one transistor of a second pair of transistors of the differential amplifier, with the second pair of transistors of a complementary transistor type to the first pair of transistors. An enabled transistor of the second pair of transistors has a first terminal connected to the voltage supply signal and a second terminal connected to a first terminal of an additional transistor of the first pair of transistors. The method further includes amplifying an input signal with the differential amplifier in the second amplifier configuration with the load line having the first impedance.

In other example aspects, an amplifier configured in a second amplifier configuration is described. The amplifier includes a first pair of transistors with a load line having a first impedance in a first amplifier configuration, with the first impedance being greater than a second impedance of the load line corresponding to the second amplifier configuration. Each transistor of the first pair of transistors has respective first terminals coupled to each other through at least one resistor. The amplifier also includes a second pair of transistors of a complementary transistor type to a first transistor type of the first pair of transistors, with the second pair of transistors deactivated in the first amplifier configuration. Each transistor of the second pair of transistors has a respective first terminal coupled to a voltage supply signal, a respective second terminal coupled to a respective third terminal of a respective transistor of the first pair of transistors, and a respective third terminal coupled to a respective component of a differential input signal to the amplifier. The amplifier further includes a third pair of transistors, with the third pair of transistors of the first transistor type. Each transistor of the third pair of transistors has a respective first terminal coupled to a respective second terminal of a respective transistor of the first pair of transistors, a respective second terminal coupled to a ground, and a respective third terminal coupled to a respective component of the differential input signal for the amplifier. Here, the first amplifier configuration includes the first pair of transistors and the third pair of transistors.

In other example aspects, a system for configuring an amplifier is described. The system includes a voltage supply for providing a voltage supply signal to the amplifier. The amplifier includes a pair of amplifier transistors designed for a load line having a first impedance in a first amplifier configuration. The system also includes one or more input transistors for coupling current from an input signal into the amplifier. The system also includes means for configuring the amplifier in a second amplifier configuration corresponding to the load line having a second impedance that is lower than the first impedance. The system further includes means for generating half-cycle delayed current from the input signal. Additionally, the system includes means for injecting the half-cycle delayed current into the amplifier in the second amplifier configuration.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF DRAWINGS

The detailed description references the accompanying figures. In the figures, the left-most digit(s) of a reference number identifies the figure in which the reference number first appears. The use of the same reference numbers in different instances in the description and the figures may indicate similar or identical items.

FIG. 12 is a flow diagram depicting an example procedure in accordance with one or more aspects of the disclosure.

FIG. 14 is a flow diagram depicting an example procedure in accordance with one or more aspects of the disclosure.

DETAILED DESCRIPTION

Figure 1:
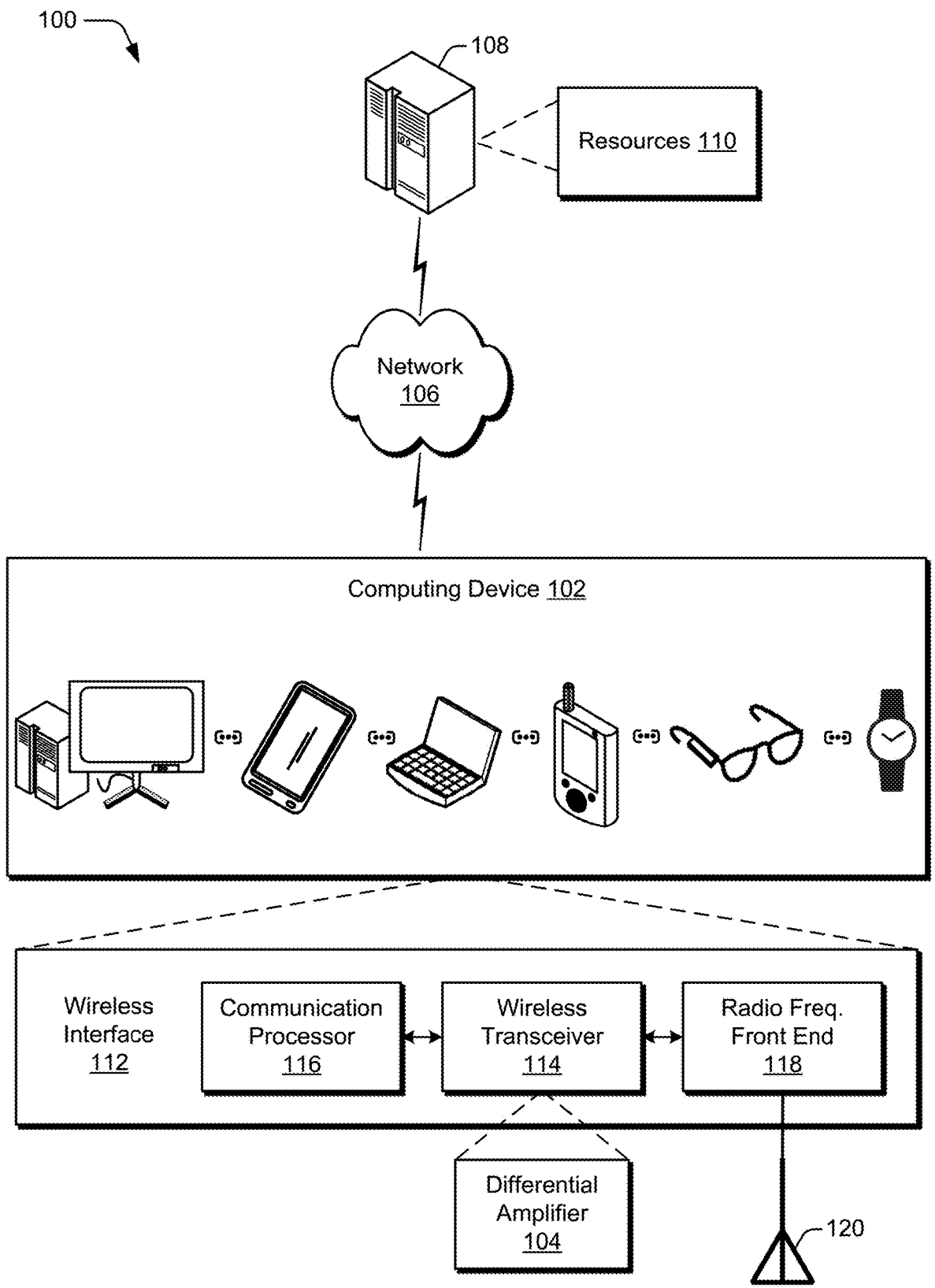
FIG. 1 illustrates an example environment that may include an amplifier in accordance with one or more aspects of the disclosure.

A common performance metric of a transmitter in a smart phone or other portable wireless electronic device is talk-time current consumption of a battery at a prescribed antenna power, which is usually indicative of an average antenna power. This antenna power translates to an operating power for a transceiver supplying a signal to an antenna of the smart phone. The load line of an amplifier in the transceiver, however, is usually designed for maximum transceiver power, and this maximum transceiver power is greater than the operating power at which battery talk-time current consumption is measured for the transceiver. Consequently, an impedance of the load line of the amplifier is generally lower than desired when battery talk-time current consumption is measured.

Several approaches can be adopted to improve the talk-time current consumption. First, a quantity of amplifier units (e.g., transistors) that are enabled in an amplifier during signal transmission can be reduced. Second, a voltage supply that is provided to the enabled amplifier units when the mobile device is transmitting can be reduced. Although these approaches can help to reduce the current consumed by the amplifiers that are part of a signal transmission uplink chain, further current reduction is usually desired to extend battery life for all-day use or with heavy-duty signal transmission demands.

Thus, it is desirable to adopt another approach to further reduce power consumption during signal transmission. One such approach is the modulation of the load line of an amplifier when a portable electronic device is transmitting. Power is proportional to the square of the current flowing through the load line and directly proportional to the impedance of the load line. Consequently, if the effective impedance of the load line can be increased, the current can be decreased while achieving the same power. For example, if the effective impedance of the load line can be increased by a factor of four during transmission, then the current can be halved with no change in the power delivered by the amplifier.

Accordingly, approaches to load line modulation attempt to increase the effective impedance of the load line of an amplifier. For example, switches can be used to switch output matching networks into the amplifier circuitry to increase the impedance of the load line. Such output matching networks include inductors and capacitors. Unfortunately, inductors and capacitors do not scale in size proportionally to process dimension (e.g., they do not follow Moore's law). As a result, in circuits built using modern process technologies, it is not uncommon for an inductor to comprise half the area of an integrated circuit. Furthermore, switches connected to inductors degrade the quality of the inductors due to leakage currents and losses of the switches that occur during interaction with the inductors.

A few other approaches can be utilized to change the effective impedance of a load line, but each is associated with one or more drawbacks. For example, multiple devices, such as transformers, that are selectively enabled to achieve a desired impedance of the load line can be used. However, multiple transformers consume too much area to be practical, and they usually need to be spatially separated on the integrated circuit, which exacerbates the area problem. Furthermore, disabling a transformer usually involves shorting the primary inductance of the transformer, which allows current to flow and reduces the effective impedance of the load line. Still other approaches add a significant amount of hardware, such as auxiliary amplifiers to modulate the impedance of the load line, phase shifters, quarter-wave transmission lines, and so forth. Besides adding cost, these other approaches are impractical for implementations in portable electronic devices that place a premium on small size and low power consumption.

In contrast, this disclosure describes methods and circuits for configuring an amplifier in at least one amplifier configuration in which the expected load line impedance is less than what is actually implemented by reconfiguring current flows within the amplifier using one or more switches. Consequently, current can be reduced for a given amount of power that is to be delivered by the amplifier. The use of expensive inductors and capacitors for impedance matching can be avoided.

In some implementations, an amplifier, such as a differential amplifier, can be reconfigured into multiple configurations—e.g., a first amplifier configuration, a second amplifier configuration, a third amplifier configuration, and a fourth amplifier configuration. The differential amplifier includes a pair of amplifier transistors designed for and implemented with a given load line impedance in the first amplifier configuration is reconfigured to the third amplifier configuration that enables a pair of complementary transistors (e.g., transistors that are of a complementary transistor type to the amplifier transistors) to operate as part of the differential amplifier in the third amplifier configuration. Differential inputs are provided to both the complementary transistors and a pair of input transistors of the differential amplifier. Thusly configured, the complementary transistors inject half-cycle-delayed current into the amplifier to reconfigure and increase the current in the amplifier. Because the current in the amplifier is increased in the third amplifier configuration (as compared to the first amplifier configuration), the corresponding impedance of the load line for the amplifier in the third amplifier configuration is less than the impedance of the load line as actually implemented. Accordingly, because the amplifier is operated in a configuration that has a greater impedance than what the amplifier "expects" to see, the current drawn from the supply voltage by the amplifier can be reduced for the same amount of power delivered by the amplifier across the first and third amplifier configurations. Talk-time current consumption can therefore be decreased.

Additionally or alternatively, a differential amplifier is configured in the second amplifier configuration (e.g., that is different from the first amplifier configuration for which the load line of the amplifier was designed) by disabling transistors on one of the differential sides of the amplifier. The reconfigured amplifier changes the expected impedance of the amplifier by reconfiguring current within the amplifier. For the fourth amplifier configuration, a differential amplifier that includes a pair of complementary transistors (e.g., like the third amplifier configuration) can be reconfigured by disabling transistors on one of the differential sides of the amplifier.

In aspects as described herein, a reconfigurable amplifier can be converted between two or more different amplifier configurations by changing states of one or more switches (e.g., by opening or closing switches). Under the control of amplifier configuration control circuitry, at least one of these switches can selectively couple different parts of a differential amplifier to different supply voltages. Additionally or alternatively, at least one of these switches can selectively couple a transistor of a pair of complementary transistors to enable the complementary transistor to operate as part of the differential amplifier. In these manners, a differential amplifier can be reconfigured by changing current flows to adjust an apparent impedance from a voltage and current perspective, which can enable decreased power usage.

Accordingly, the disclosed methods and circuits can avoid adopting approaches that add output matching networks or other expensive hardware (e.g., transformers, inductors, capacitors, phase shifters, quarter-wave transmission lines, and so forth) to modulate the impedance of a load line in an amplifier. Instead, in accordance with certain aspects, low-power complementary transistors and amplifier configuration circuitry (e.g., switches) are included with a reconfigurable amplifier without changing the implemented impedance of the load line (e.g., without swapping electromagnetic (EM) components of the amplifier output). Furthermore, the low-power complementary transistors and amplifier configuration circuitry scale with semiconductor geometry (e.g., they follow Moore's Law), and they therefore consume relatively little chip area. Consequently, the methods and circuits described herein are well-suited for implementations in mobile devices that place a premium on small size and low power consumption.

In the following discussion, example systems including amplifiers and amplifier configuration circuitry are described. Techniques that components of the example system may implement, and a computing device on which elements of the example system may be included, are also described. Consequently, performance of the example procedures is not limited to the example system, and the example system is not limited to performance of the example procedures. Any reference made with respect to the example system, or components thereof, is by way of example only and is not intended to limit any of the aspects described herein.

Example Environment

FIG. 1 illustrates an example environment 100 in accordance with one or more aspects of the disclosure. The example environment 100 includes a computing device 102. The computing device 102 may be configured as any suitable type of computing device (e.g., a mobile device, a fixed device, or a wireless electronic device). For example, the computing device 102 may be configured as a server, a server farm, a desktop computer, a laptop computer, a workstation, a mobile device, a tablet, a mobile phone (e.g., a smart phone), a personal digital assistant, a router, a modem, a gateway, a camera, a gaming station, a wearable device (e.g., a smart wristwatch or smart eyeglasses), smart appliance, medical device, vehicle-based communication system, Internet-of-Things (IoT) device, smart-home or security device, wireless power device, and so forth. Thus, the computing device 102 may range from a full-resource device with substantial memory and processor resources (e.g., servers and personal computers) to a low-resource device with limited memory or processing resources (e.g., wearable devices). Additionally, the computing device 102 may be representative of a plurality of different devices, such as multiple devices in a server farm of a service provider, or a single computing device, such as an end-user device.

The computing device 102 is illustrated as including a differential amplifier 104 as part of a wireless transceiver 114. The wireless transceiver 114 can be part of a wireless interface 112. The wireless interface 112 can include a communication processor 116 and a radio-frequency front end 118 (RFFE 118), in addition to the wireless transceiver 114. However, the computing device 102 can also include a variety of other components, which are not shown in FIG. 1 for simplicity. For example, the computing device 102 can include one or more processing devices, one or more computer-readable storage media, and various applications (e.g., a web browser which is operable to access various kinds of web-based resources from cloud servers) embodied on the computer-readable storage media and operable via a processing system.

In some implementations, the wireless interface 112 of the computing device 102 provides connectivity to respective networks and peer devices via a wireless link. Alternatively or additionally, the computing device 102 may include a wired interface, such as an Ethernet or fiber optic transceiver for communicating over a wired local network, an intranet, or the Internet. The wireless interface 112 may facilitate communication over any suitable type of wireless network, such as a wireless local area network (LAN) (WLAN), peer-to-peer (P2P) network, mesh network, cellular network, wireless wide-area-network (WWAN), and/or wireless personal-area-network (WPAN). In the context of the example environment 100, the computing device 102 communicates various data and control information via the wireless interface 120 to a remote device, which may be part of a base station (not explicitly shown) or an internet server, for example. The computing device 102 may also communicate directly with peer devices and the like.

As shown, the wireless interface 112 includes the communication processor 116, the wireless transceiver 114, and the RFFE 118 to process data and signals associated with communicating data of the computing device 102 over one or more antennas 120. The communication processor 116 may generally be realized as a modem (e.g., a baseband modem), as a digital signal processor (DSP), or as a communications-oriented processing unit that is configured to perform signal processing to support communication via one or more networks. The communication processor 116 may be implemented as a system on-chip (SoC) that provides a digital communication interface for data, voice, messaging, and other applications of the computing device 102. The communication processor 112 may also include baseband circuitry to perform high-rate sampling processes that can include analog-to-digital conversion (ADC), digital-to-analog conversion (DAC), gain correction, skew correction, frequency translation, and so forth.

Further, the communication processor 112 may include logic to perform in-phase/quadrature (I/Q) operations, such as synthesis, encoding, modulation, demodulation, and decoding. Alternatively, ADC or DAC operations may be performed by a separate component or another illustrated component, such as the wireless transceiver 114. Additionally, the communication processor 116 may also manage (e.g., control or configure) aspects or operation of the transceiver 114, the RFFE 118, or other components of the wireless interface 112 to implement various communication protocols or communication techniques. For instance, the communication processor 116 can control reconfiguration of the differential amplifier 104 as described herein.

The wireless transceiver 114 includes circuitry and logic for filtering, amplification, channelization, and frequency translation, which may be an up-conversion or down-conversion of frequency, which is performed in a single conversion or through multiple conversion steps. The wireless transceiver 114 can also include a digital-to-analog converter (DAC) that converts digital values to an analog signal for amplification and filtering by circuitry of the wireless transceiver 114 or an analog-to-digital converter (ADC) to convert analog signals to digital values for communication processing.

The components or circuitry of the wireless transceiver 114 can be implemented in any suitable fashion, such as combined transceiver logic or separately as respective receiver and transmitter entities. In some cases, the wireless transceiver 114 is implemented with multiple or different sections to implement respective receiving and transmitting operations (e.g., separate receive and transmit chains). The wireless transceiver 114 may also include logic to perform in-phase/quadrature (I/Q) operations, such as synthesis, phase correction, modulation, demodulation, and the like.

The RFFE 118 can include filters, switches, and amplifiers for conditioning signals received via the antenna 120 or signals to be transmitted via the antenna 120. The RFFE 118 may also include other RF sensors and components, such as a peak detector, power meter, gain control block, antenna tuning circuit, diplexer, balun, and the like. Configurable components of the RFFE 118 may be controlled by the communication processor 116 to implement communications in different modes or frequency bands or in accordance with different wireless standards.

The wireless transceiver 114 may include one or more amplifiers. Examples of amplifiers include low-noise amplifiers (LNAs) (e.g., for a receive chain) and driver or power amplifiers (e.g., for a transmit chain). Any one or more of these or other types of amplifiers, that are part of a wireless transceiver 114 or that are included elsewhere in a computing device 102, may be implemented as a differential amplifier, such as the differential amplifier 104. Thus, the differential amplifier 104 can be implemented as any suitable type of differential amplifier and can be implemented for any suitable purpose in the computing device 102. In one example, the differential amplifier 104 comprises a driver amplifier for a power amplifier that supplies a signal to the antenna 120 during transmission, such as during a telephone call on a mobile phone. The differential amplifier 104 can provide an amplified signal (e.g., a pre-amplified signal) to a switch matrix that selects an appropriate power amplifier from multiple power amplifiers, such as power amplifiers for different bandwidths, operating frequencies, and communications protocols. Additionally or alternatively, the differential amplifier 104 can comprise a low-noise amplifier that accepts a signal received by the computing device 102 via the antenna 120.

The example environment 100 also includes a network 106 and one or more devices 108 that are communicatively coupled to the computing device 102 via the network 106. The one or more devices 108 can operate as, for instance, one or more service providers configured to make various resources 110 available over the network 106 to one or more clients (e.g., the computing device 102). In some scenarios, users may sign up for accounts that are employed to access corresponding resources from a provider. The provider may authenticate credentials of a user (e.g., a username and password) before granting access to an account and corresponding resources. Resources 110 may be licensed, purchased, or made freely available (e.g., without authentication, license, or account-based access). Resources 110 can include any suitable combination of services and content made available over the network 106, such as a video-editing service, a photo-editing service, a web development and management service, a collaboration service, a social networking service, a messaging service, an advertisement service, a conferencing service, a telephone service, and so forth. Content may include various combinations of assets, including videos, ads, audio, multi-media streams, animations, images, web documents, web pages, applications, device applications, text documents, text messages, drawings, presentations, files (e.g., configuration files and device driver files), maps, and the like.

In one example, the one or more devices 108 comprise one or more cell phones, and the network 106 comprises a cellular network that enables a user of the computing device 102 to participate in a conversation (e.g., sharing audio, video, text, data, or combinations thereof) with one or more respective users of the one or more devices 108. The network 106, however, may include a variety of networks, including the Internet, an intranet, a local area network (LAN), a wide area network (WAN), a personal area network (PAN), a body area network (BAN), one or more cellular networks, one or more terrestrial networks, a satellite network, combinations of networks, and the like, and as such may be wired, wireless, or a combination thereof.

Although the network 106 and the one or more devices 108 are illustrated in FIG. 1 separately from the computing device 102, the computing device 102 may form a part of the network 106 or the one or more devices 108. Further, the one or more devices 108 may also include one or more differential amplifiers that are similar or analogous to the differential amplifier 104. Consequently, the techniques and circuits described herein may be practiced with any suitable differential amplifier, such as a differential amplifier 104 that can be part of the computing device 102 or a differential amplifier 104 that can be part of the one or more devices 108 or a component of the network 106.

Having considered an example environment 100, consider now a discussion of example amplifier circuits.

Example Amplifier Circuits from a Voltage and Current Perspective

Example aspects of the disclosure use a differential amplifier, such as in a class-B fashion with half-wave rectified signals, that is designed for a first impedance load line in a first amplifier configuration. Aspects of the disclosure reconfigure the differential amplifier in other amplifier configurations corresponding to the load line having different impedances that are less than the first impedance from a voltage and current perspective. By operating the amplifier in the other configurations with the load line having the first impedance rather than the other, lower impedances, the impedance of the load line "seen" by the amplifier is greater than what is "expected" by the amplifier. Thus, for a given transmit power level, lower current levels can be used such that less power is consumed.

In some implementations, the amplifier is configured in a second amplifier configuration by disabling transistors on one of the differential sides of the amplifier. In a third amplifier configuration, the amplifier is configured by activating a pair of complementary transistors that are included as part of, or are coupled to, the differential amplifier. In a fourth amplifier configuration, the amplifier is configured by both activating a pair of complementary transistors of the differential amplifier and disabling transistors on one of the differential sides of the differential amplifier. The reconfigured amplifier changes the effective impedance of the amplifier (e.g., the impedance of the load line that the amplifier expects to see in a respective amplifier configuration) by reconfiguring current within the amplifier, as is explained below.

In accordance with some implementations, four different load line impedances can exist, or be created, for a differential amplifier. In general, $2^N$ different load line impedances can be realized, where "N" is the number of signal phases, and N=2 corresponds to a differential signal. By way of example, differential amplifiers are described herein with two signal phases. However, amplifiers with any suitable number of signal phases can be constructed using aspects of reconfiguring amplifiers for load-line enhancement as described herein. Accordingly, although differential amplifiers are described herein by way of example, amplifiers implementing aspects of the disclosure are not limited to differential amplifiers, for they can be implemented using any suitable number of phases, such as 2, 4, or 8.

Consider next a discussion of examples of each of four amplifier configurations for an example differential amplifier from a voltage and current perspective. The first amplifier configuration includes a pair of amplifier transistors and a pair of input transistors (e.g., coupled together in a cascode arrangement). In a second amplifier configuration, two individual transistors (one transistor from each pair of transistors) are disabled during some operations, such as during talk time. A third amplifier configuration includes a pair of complementary transistors respectively coupled to each pair of the cascode-arranged transistors. A fourth amplifier configuration includes the complementary transistors but disables three individual transistors (one transistor from each of the three pairs of transistors). Although some of the description in this paragraph (e.g., the precise quantities of transistors) pertains to differential amplifier implementations with two amplifier transistors and two input transistors, the principles are applicable to other implementations having banks of amplifier and input transistors as described below.

First Amplifier Configuration from a Voltage and Current Perspective

Figure 2:
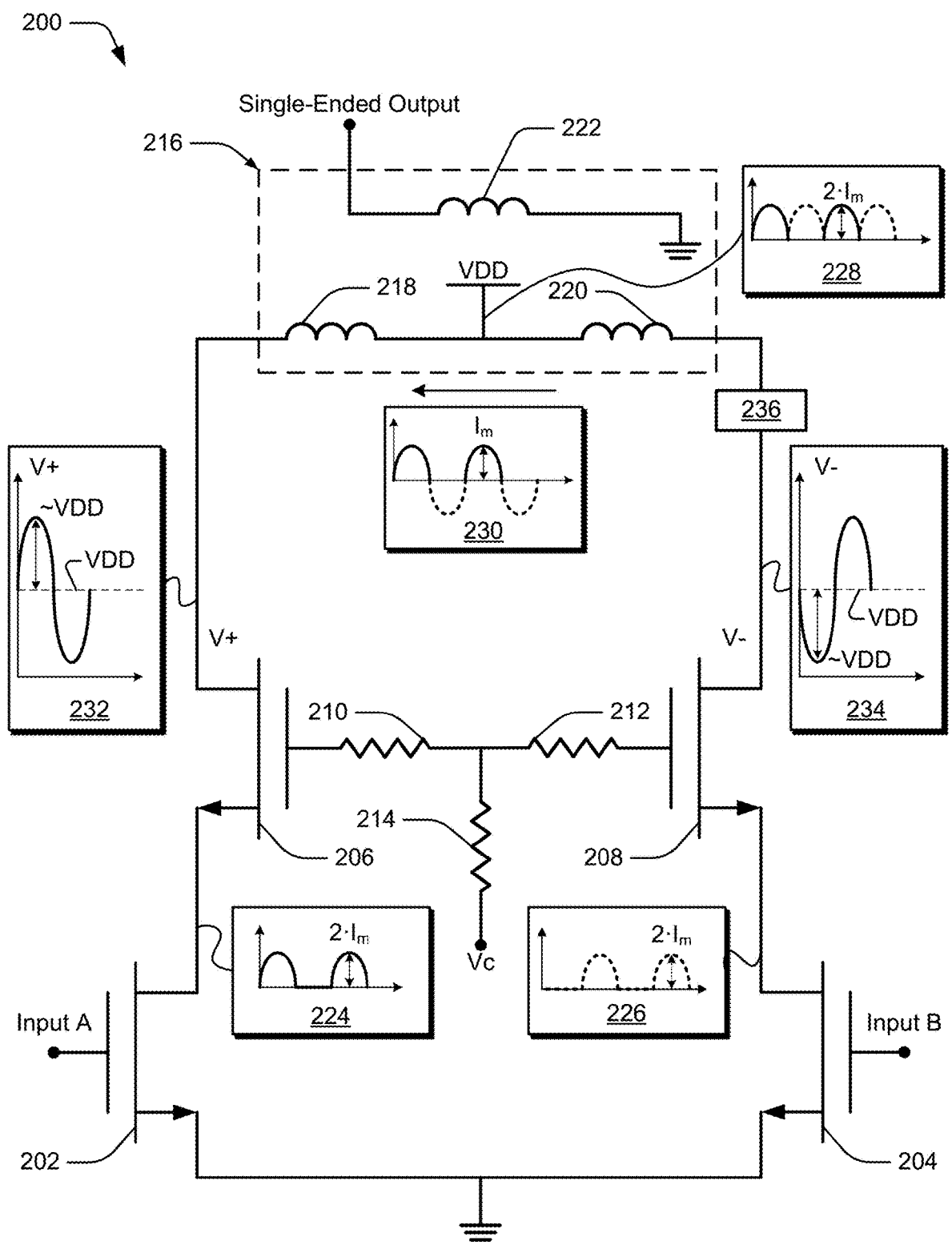
FIG. 2 illustrates, from a voltage and current perspective, an example amplifier in a first circuit configuration in accordance with one or more aspects of the disclosure.

FIG. 2 illustrates an example first amplifier configuration 200 in accordance with one or more aspects of the disclosure. The example first amplifier configuration 200 is an example implementation of the differential amplifier 104 in FIG. 1. The circuit of the first example amplifier configuration 200 includes a pair of input transistors 202 and 204 and a pair of amplifier transistors 206 and 208. The amplifier transistors 206 and 208 are respectively coupled in series with the input transistors 202 and 204—e.g., in a cascode arrangement. The input transistors 202 and 204 and the amplifier transistors 206 and 208 can be implemented as any suitable type of transistor, such as a metal-oxide-semiconductor field-effect transistor (MOSFET), a junction field-effect transistor (JFET), metal-semiconductor field-effect transistor (MESFET), a bipolar junction transistor (BJT), and so forth. These four transistors can operate in any suitable type of mode, such as depletion mode or enhancement mode, and can be constructed as n-channel or p-channel. The input transistors 202 and 204 and the amplifier transistors 206 and 208 are illustrated in FIG. 2 as n-channel metal-oxide-semiconductor (NMOS) FET transistors for example purposes.

A differential input signal applied to the example amplifier circuit of the first amplifier configuration 200 includes two components, Input A and Input B, that are supplied to respective terminals of the input transistors 202 and 204 (e.g., respective gates of the input transistors 202 and 204). For instance, Input A can represent a positive or plus input, and Input B can represent a negative or minus input. The input transistors 202 and 204 have respective other terminals (e.g., sources) coupled to ground (e.g., any suitable equipotential node). The input transistors 202 and 204 also have respective additional terminals (e.g., drains) coupled to respective terminals (e.g., sources) of the amplifier transistors 206 and 208, respectively.

Figure 7:
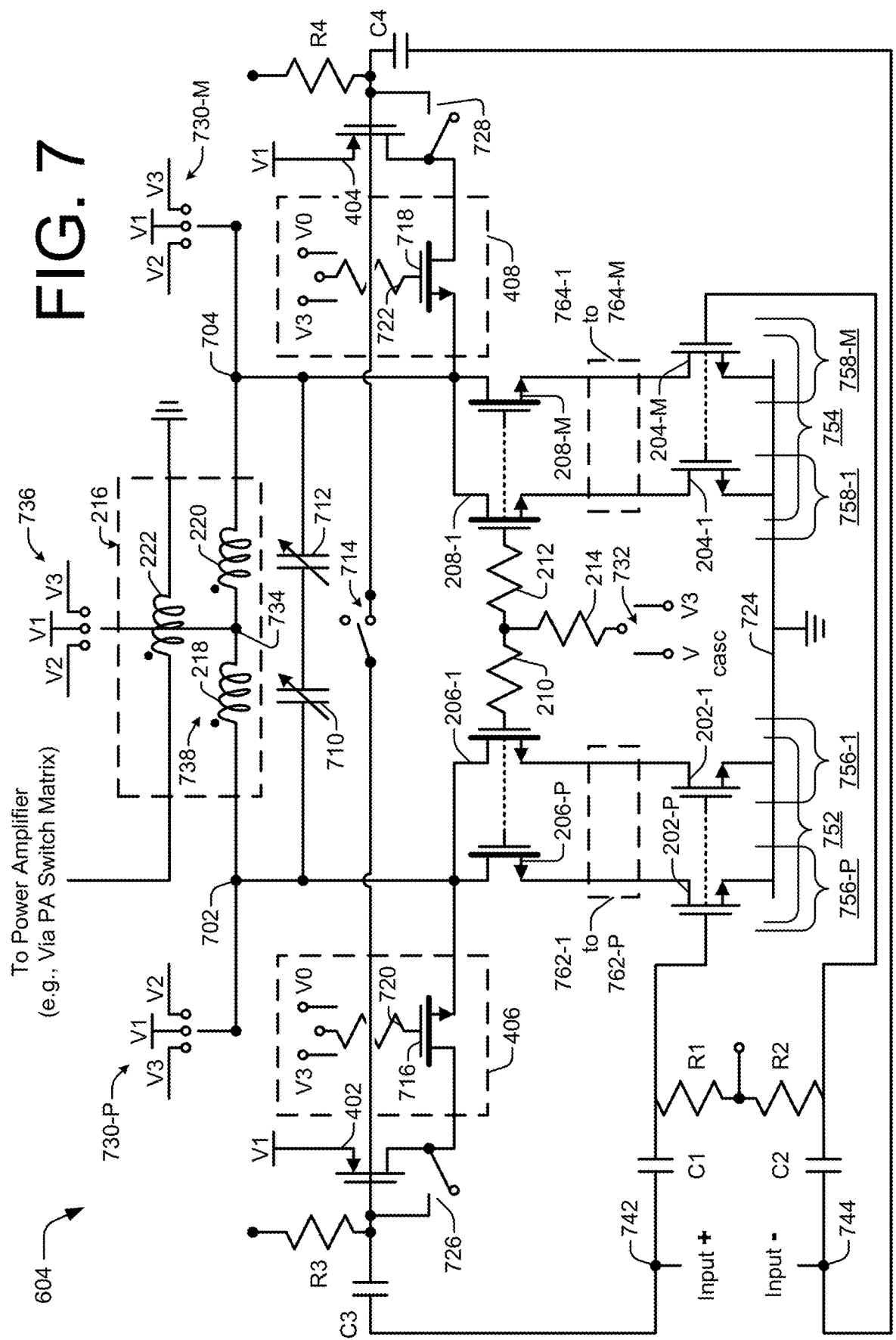
FIG. 7 illustrates, from a circuit perspective, an example amplifier circuit that can be activated into different configurations using one or more switches in accordance with one or more aspects of the disclosure.

Other respective terminals (e.g., gates) of the amplifier transistors 206 and 208 are resistively coupled through a resistor network including resistor 210, resistor 212, and resistor 214. The resistors 210, 212, and 214 can have any suitable resistor values. In one example, the resistor 210 and the resistor 212 are a same nominal resistance, such as 12 ohms, and the resistor 214 is a larger resistance, such as 14.7 kilo-ohms. A control voltage $V_c$ is supplied, such as from a voltage supply circuit (not shown), to one terminal of the resistor 214 to suitably bias the amplifier transistors 206 and 208. The control voltage $V_c$ can be set to any suitable voltage. In one example, the control voltage $V_c$ is set to 1.8 volts. In another example, the control voltage $V_c$ is set to 1.0 volts. The control voltage $V_c$ can be set to different voltages using, for instance, at least one switch (e.g., as shown in FIG. 7). The amplifier transistors 206 and 208 amplify the differential signals coupled via the input transistors 202 and 204 according to a supply voltage $V_{DD}$ to form differential outputs $V^+$ and $V^-$. Respective additional terminals (e.g., drains) of the amplifier transistors 206 and 208 couple the differential outputs $V^+$ and $V^-$ to differential inputs of a differential-to-single-ended converter 216.

The differential-to-single-ended converter 216 receives the differential outputs $V^+$ and $V^-$ and converts them to a single-ended output with inductors 218, 220, and 222. The inductors 218 and 220 are coupled together in series between respective terminals (e.g., drains) of the amplifier transistors 206 and 208. The supply voltage $V_{DD}$ is provided, such as from a voltage supply circuit of the illustrated amplifier circuit, between the inductor 218 and the inductor 220. The inductors 218 and 220 are electromagnetically coupled to the inductor 222. The single-ended output of the differential-to-single-ended converter 216 is provided on one end of the inductor 222, and the other end of the inductor 222 is grounded.

In example operation, the signals in the first amplifier configuration 200 are half-wave rectified (e.g., in a class-B fashion), and the two phases of the current in the first amplifier configuration 200 are shown in solid and dashed lines, respectively, in the inlays 224, 226, 228, and 230. For instance, current represented by dashed lines is half-cycle delayed relative to current represented by solid lines. Inlays 224 and 226 illustrate currents on the respective drains of the input transistors 202 and 204, and inlay 228 illustrates current provided by the supply voltage $V_{DD}$. The peak value of the current (e.g., the swing) in these inlays has a value of $2 \cdot I_m$ current units (for any suitable unit of current, such as milli-amps (mA)). For the half-rectified current having a peak of $2 \cdot I_m$ current units, a differential current flowing through the amplifier transistors 206 and 208 (e.g., the difference between a current flowing through the amplifier transistor 206 and a current flowing through the amplifier transistor 208) has a peak value (or swing) of $I_m$ current units (e.g., the fundamental component of the Fourier transform of the current has a value of $I_m$), as illustrated in inlay 230.

The differential output voltages $V^+$ and $V^-$ of the amplifier transistors 206 and 208 are illustrated in inlays 232 and 234, respectively. The differential output voltages $V^+$ and $V^-$ are centered at approximately the supply voltage $V_{DD}$. Furthermore, neglecting the saturation voltage of the amplifier transistors 206 and 208, each of the differential output voltages $V^+$ and $V^-$ has a peak voltage of approximately the supply voltage $V_{DD}$. The peak of the differential voltage, defined as the peak of $V^+ - V^-$, is therefore:

$$V_{diff,pk} = 2 \cdot V_{DD}.$$

The impedance of the load line can be represented by the ratio of the peak of the differential voltage $V_{diff,pk}$ to the differential current flowing through the amplifier transistors 206 and 208. Accordingly, the impedance of the load line for the first amplifier configuration 200 (which is defined as R) is given by:

$$\frac{2 \cdot V_{DD}}{I_m} \equiv R.$$

The amplifier transistors 206 and 208 are designed and built to provide this load line impedance, at a specified power level. If the amount of current flowing through the amplifier transistors 206 and 208 can be increased in a modified version of the amplifier circuit depicted in FIG. 2, the desired impedance of the load line in that modified configuration will be reduced. Switch 236 is an example of amplifier configuration circuitry that can be used to reconfigure the example amplifier circuit of FIG. 2 and modulate the load line, as discussed in more detail below. By using one or more of the amplifier transistors 206 and 208 in a modified amplifier configuration that "expects" to see a load line having a lower impedance than R but that is actually implemented with a load line having the impedance of R, the actual impedance of the load line "seen" by the amplifier transistors 206 and 208 in the modified configuration of the amplifier is greater than what is expected in that configuration. Accordingly, for the same output power, the current provided by the supply voltage $V_{DD}$ to the amplifier can be reduced by an amount equal to the square root of the reduction in impedance, thus improving talk-time current consumption.

In one example, the impedance R is based on the voltage supply signal $V_{DD}$, as described above. Additionally or alternatively, the impedance R can be based on (e.g., designed for) a voltage other than the voltage supply signal $V_{DD}$, such as a higher voltage than the voltage supply signal $V_{DD}$.

Having considered a discussion of the example first amplifier configuration 200, consider now another example amplifier circuit representing a second amplifier configuration.

Second Amplifier Configuration from a Voltage and Current Perspective

Figure 3:
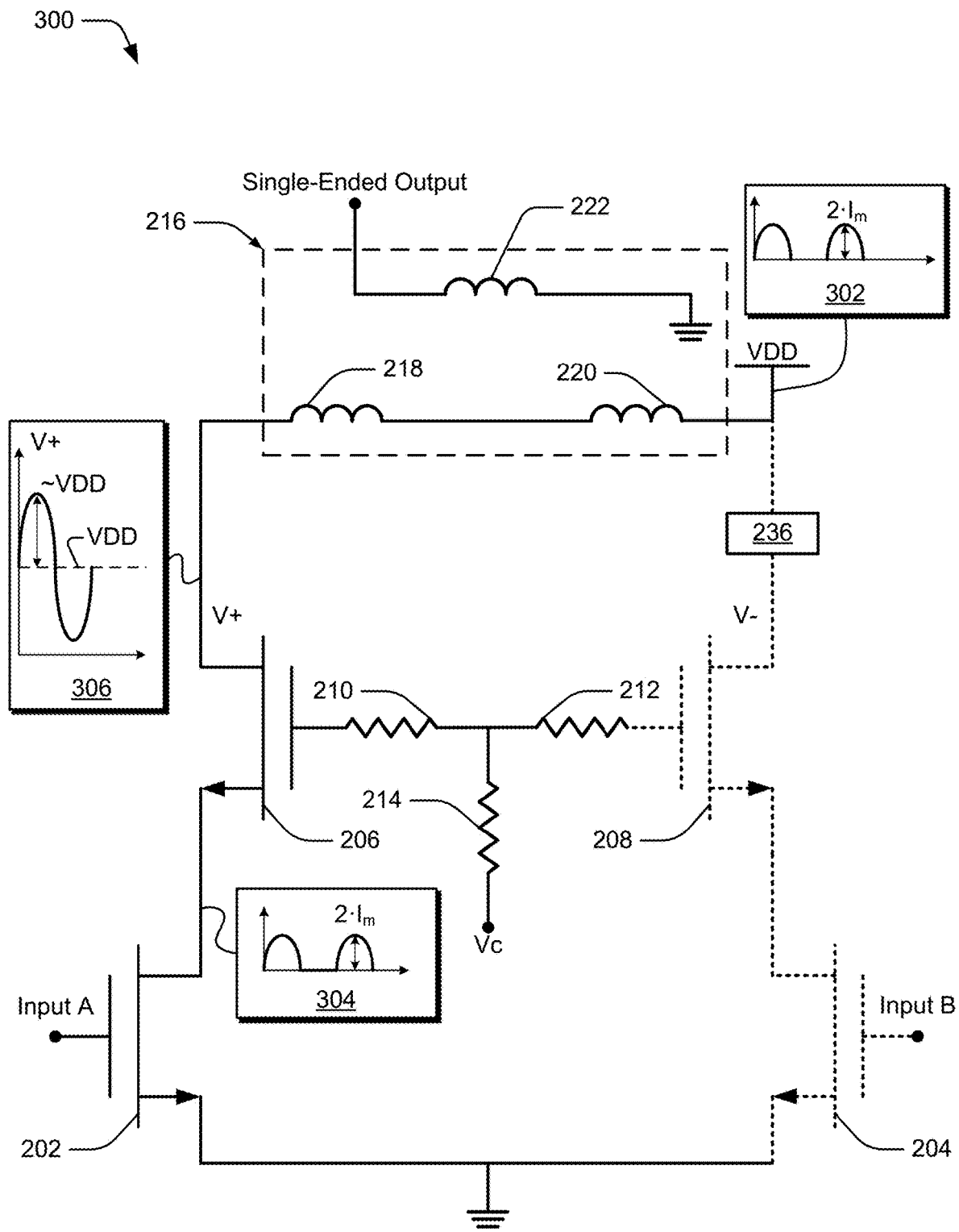
FIG. 3 illustrates, from a voltage and current perspective, an example amplifier in a second circuit configuration in accordance with one or more aspects of the disclosure.

FIG. 3 illustrates an example second amplifier configuration 300 in accordance with one or more aspects of the disclosure. The example second amplifier configuration 300 is another example configuration of the differential amplifier 104 in FIG. 1. The circuit of the example second amplifier configuration 300 includes the input transistor 202 and the amplifier transistor 206 in an active mode or enabled state as described with respect to FIG. 2. However, unlike with the circuit of FIG. 2, the example second amplifier configuration 300 in FIG. 3 disables one side of the differential amplifier by disabling one transistor of each pair of transistors (e.g., one input transistor and one amplifier transistor as shown). For instance, the input transistor 204 and the amplifier transistor 208 are illustrated in FIG. 3 with dashed lines to denote that the input transistor 204 and the amplifier transistor 208 are disabled to operationally decouple them from the amplifier circuit in the second amplifier configuration 300. The input transistor 204 and the amplifier transistor 208 can be disabled in any suitable way, such as with amplifier configuration circuitry containing switches that disconnect the input transistor 204 or the amplifier transistor 208 from the illustrated circuit. This disconnection can be accomplished, for example, by setting appropriate bias voltages, by using control voltages (such as $V_c$), or combinations thereof. Switch 236 is an example of a switch that can be included in the amplifier configuration circuitry to disable the input transistor 204 and the amplifier transistor 208.

Further, although the minus side of the example second amplifier configuration 300 is illustrated in FIG. 3 as being disabled, the plus side can alternatively be disabled. The plus side can be disabled by, for example, disabling the input transistor 202 or the amplifier transistor 206 with respect to the remainder of the example amplifier circuit instead of disabling the input transistor 204 and the amplifier transistor 208.

In FIG. 3, the supply voltage $V_{DD}$ is connected to a different end of the inductor 220—e.g., at an external node of the differential-to-single-ended converter 216, instead of at an internal node between the inductor 220 and the inductor 218 as shown in FIG. 2. Further, the current provided by the supply voltage $V_{DD}$ is illustrated in inlay 302. As illustrated by inlay 302, because one side of the differential amplifier is disabled, the half-cycle delayed current is omitted. For instance, inlay 304 shows the current at the drain of the input transistor 202. Inlay 304 shows the same current flow as inlay 224 in FIG. 2. However, because the input transistor 204 is disabled, there is no appreciable current, and there is therefore no illustrated inlay of current in FIG. 3, for the input transistor 204 (e.g., the current is substantially zero at the drain of the input transistor 204 due to the right or minus amplifier branch being disabled).

Similarly, because the amplifier transistor 208 is disabled, the component of the output voltage $V^-$ generated by the amplifier transistor 208 is substantially zero, and FIG. 3 therefore has no inlay for the output voltage $V^-$. The component of the output voltage $V^+$ generated by the amplifier transistor 206, however, is determined at least partially by the supply voltage $V_{DD}$ and is illustrated in the inlay 306. The component of the output voltage $V^+$ is centered at approximately the supply voltage $V_{DD}$, and, neglecting the saturation voltage of the amplifier transistor 206, has a peak voltage of approximately the supply voltage $V_{DD}$.

The peak of the differential voltage $V^+-V^-$ for the example second amplifier configuration 300 is therefore $V_{diff,pk}=V_{DD}$. The differential current flowing through the amplifier transistor 206 retains a value of $I_m$ current units (e.g., the fundamental component of the Fourier transform of the current has a value of $I_m$). Hence, the "desired" impedance of the load line for the second amplifier configuration 300 is:

$$\frac{V_{DD}}{I_m} = R/2.$$

This R/2 impedance is the desired impedance because it is the ratio of the peak of the differential voltage to the differential current flowing in the example amplifier circuit for the second amplifier configuration 300.

Although the desired impedance of the load line is R/2 for the second amplifier configuration 300, the amplifier transistors 206 and 208 are designed and built to provide a load line impedance of R. Accordingly, the example second amplifier configuration 300 "sees" an impedance of the load line that is twice what is "expected." Consequently, the current supplied to the amplifier by the voltage supply $V_{DD}$ for the example second amplifier configuration 300 in FIG. 3 can be reduced by $\sqrt{2}$ for the same power delivered by the amplifier as compared to the example first amplifier configuration 200 in FIG. 2.

Having considered a discussion of the example second amplifier configuration 300, consider now another amplifier circuit representing an example third amplifier configuration.

Third Amplifier Configuration from a Voltage and Current Perspective

Figure 4:
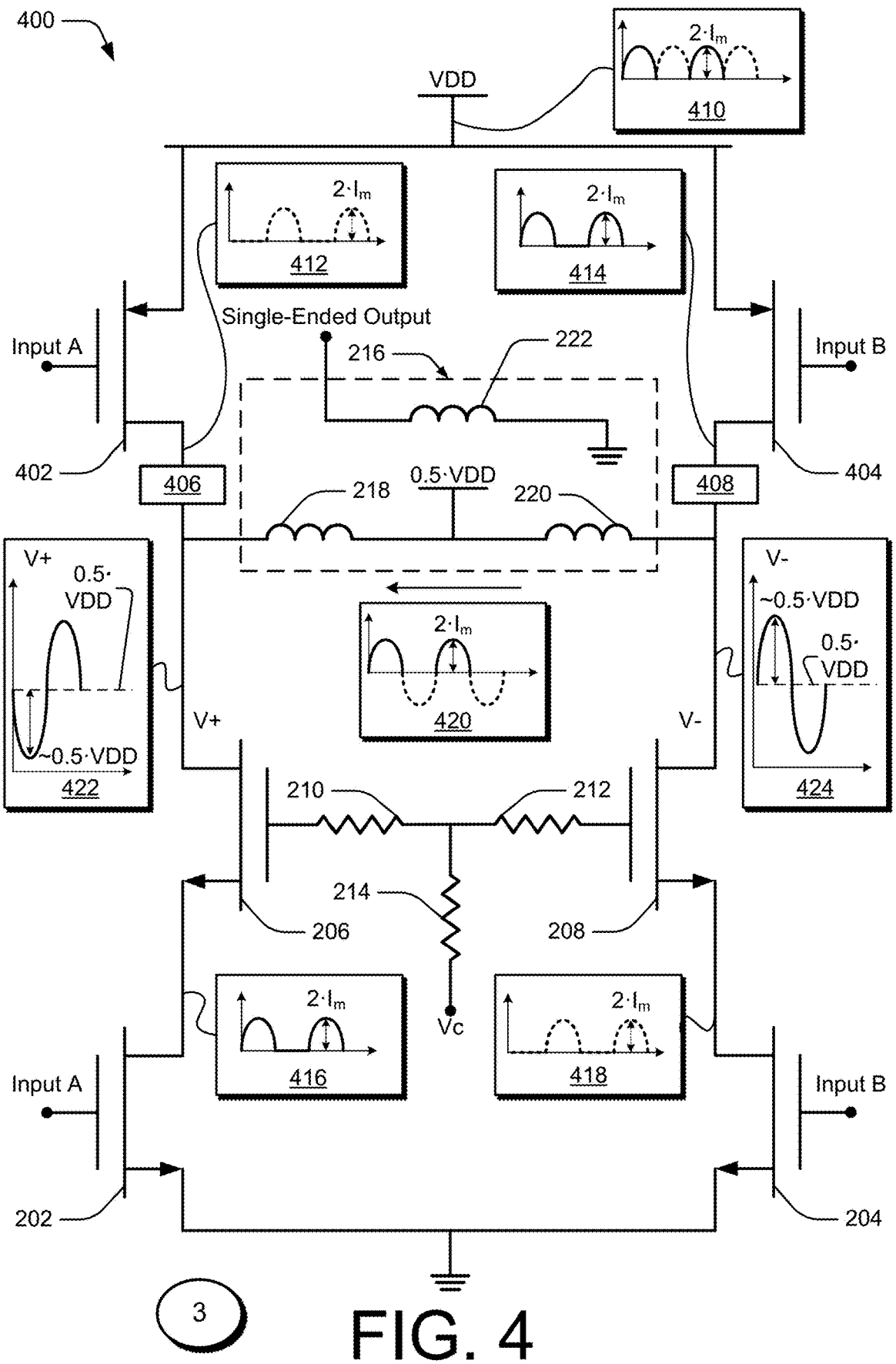
FIG. 4 illustrates, from a voltage and current perspective, an example amplifier in a third circuit configuration in accordance with one or more aspects of the disclosure.

FIG. 4 illustrates an example third amplifier configuration 400 in accordance with one or more aspects of the disclosure. The example third amplifier configuration 400 can be implemented with the differential amplifier 104 in FIG. 1. The example third amplifier configuration 400 can reconfigure current in the amplifier circuit by injecting half-cycle delayed current into the amplifier to achieve an "expected" impedance of the load line corresponding to R/4.

The circuit of the example third amplifier configuration 400 includes the input transistors 202 and 204 and the amplifier transistors 206 and 208 in an active mode or enabled state as described with reference to FIG. 2. However, unlike the example first amplifier configuration 200 of FIG. 2, the example third amplifier configuration 400 in FIG. 4 additionally includes complementary transistors 402 and 404. The complementary transistors 402 and 404 are respectively coupled in series with the amplifier transistors 206 and 208 via respective switches 406 and 408. The pair of complementary transistors 402 and 404 are disposed between the amplifier transistors 206 and 208 and the supply voltage signal $V_{DD}$. The complementary transistors 402 and 404 are of a complementary transistor type with respect to the amplifier transistors 206 and 208 and the input transistors 202 and 204.

For instance, the amplifier transistors 206 and 208 and the input transistors 202 and 204 in FIG. 4 are illustrated as n-channel metal-oxide-semiconductor (NMOS) devices, and the complementary transistors 402 and 404 are illustrated as PMOS devices. The complementary transistors 402 and 404 can be any suitable type of complementary transistor to the amplifier transistors 206 and 208 and the input transistors 202 and 204, such as a MOSFET, JFET, MESFET, BJT, and the like. Further, the complementary transistors 402 and 404 can operate in any suitable type of mode, such as depletion mode or enhancement mode, and can be n-channel or p-channel.

The complementary transistors 402 and 404 have respective terminals (e.g., gates) supplied with the same differential components of the input signal (e.g., Input A and Input B, respectively) as the respective gates of the input transistors 202 and 204. The complementary transistors 402 and 404 have respective other terminals (e.g., sources) coupled to the supply voltage $V_{DD}$. The complementary transistors 402 and 404 are selectively coupled to the amplifier transistors 206 and 208, respectively, by way of additional terminals (e.g., drains) of the complementary transistors 402 and 404 being coupled to the switches 406 and 408.

Because the complementary transistors 402 and 404 are of a complementary transistor type as the input transistors 202 and 204, the complementary transistors 402 and 404 inject current that is a half-cycle delayed relative to the current provided from the input transistors 202 and 204, respectively. For instance, an inlay 410 shows the current supplied by the supply voltage $V_{DD}$. The current injected from the complementary transistors 402 and 404 is illustrated in inlays 412 and 414, respectively. The current from the input transistors 202 and 204 is illustrated in inlays 416 and 418, respectively. Inlays 416 and 418 show the same current flows as inlays 224 and 226 in FIG. 2, respectively. In the inlays showing current in FIG. 4, the two phases of the current in the example third amplifier configuration 400 are shown in solid and dashed lines. For instance, current represented by dashed lines is half-cycle delayed relative to current represented by solid lines.

The current injected by the complementary transistor 402 illustrated in inlay 412 is half-cycle delayed compared to the current from the input transistor 202 illustrated in inlay 416. On the other side of the amplifier, the current injected by the complementary transistor 404 illustrated in inlay 414 is half-cycle delayed compared to the current from the input transistor 204 illustrated in inlay 418. Consequently, the differential current flowing through the amplifier transistors 206 and 208 is doubled relative to the amplifier configuration in FIG. 2, so the differential current has a peak value of $2 \cdot I_m$ rather than $I_m$, as illustrated in inlay 420.

Moreover, the amplifier transistors 206 and 208 in the example third amplifier configuration 400 are coupled to $0.5 \cdot V_{DD}$ via the internal node (which is also referred to herein as an inter-inductor node) of the differential-to-single-ended converter 216, with the internal node being located between the inductor 218 and the inductor 220. As shown, the drain terminals of the amplifier transistors 206 and 208 are coupled to $0.5 \cdot V_{DD}$ via the inductors 218 and 220, respectively. By coupling the transistors to the supply voltage $0.5 \cdot V_{DD}$ in this manner, the NMOS and PMOS transistors are symmetric, and no appreciable current flows through the internal node between the inductors 218 and 220. As a result of this supply-voltage coupling (e.g., at $0.5 \cdot V_{DD}$) at the drains of the amplifier transistors 206 and 208, the differential output voltages $V^+$ and $V^-$ are centered at approximately half the supply voltage, $0.5 \cdot V_{DD}$. Further, neglecting the saturation voltage of the amplifier transistors 206 and 208, each of the differential output voltages $V^+$ and $V^-$ has a peak voltage (e.g., voltage swing) of approximately half the supply voltage, or $0.5 \cdot V_{DD}$, as illustrated in inlays 422 and 424. The peak of the differential voltage, $V^+-V^-$, is therefore:

$$V_{diff,pk} = V_{DD}.$$

The "desired" impedance of the load line for the example third amplifier configuration 400 is thus:

$$\frac{V_{DD}}{2 \cdot I_m} = R/4.$$

This impedance of R/4 is the desired impedance because it is the ratio of the peak of the differential voltage to the differential current flowing in the circuit of the example third amplifier configuration 400.

Although the desired impedance of the load line is R/4 for this third amplifier configuration, the amplifier transistors 206 and 208 are designed and built to provide a load line impedance of R. Accordingly, the amplifier circuit configured according to FIG. 4 "sees" an impedance of the load line that is quadruple what is "expected." Accordingly, the current can be reduced by $\sqrt{4}$, or a factor of two, for the same power as compared to the example first amplifier configuration 200 in FIG. 2.

Furthermore, the complementary transistors 402 and 404 can be selectively activated to create the example third amplifier configuration 400, such as during uplink transmission with a receiving entity that is closer, using the switches 406 and 408. The switches 406 and 408 can isolate the amplifier transistors 206 and 208 from voltage supply signals of a semiconductor chip on which the amplifier circuit is disposed. The switches 406 and 408 can be any suitable type of switch. In one example, the switches 406 and 408 include transistor switches, such as a switch constructed from a PMOS transistor. A gate of the transistor switch can be appropriately biased to enable and disable the transistor switch, such as by setting the gate to 0 volts and 1.8 volts, respectively. The bias voltage applied to the transistor switch can be resistively coupled (e.g., applied with a series resistor) to the gate of the transistor switch. Moreover, the complementary transistors 402 and 404 can be implemented as low power transistors, so the additional power drawn by the complementary transistors 402 and 404 is small relative to the current reduction achieved by utilizing the example third amplifier configuration 400.

Having considered a discussion of the example third amplifier configuration 400, consider now another amplifier circuit representing an example fourth amplifier configuration.

Fourth Amplifier Configuration from a Voltage and Current Perspective

Figure 5:
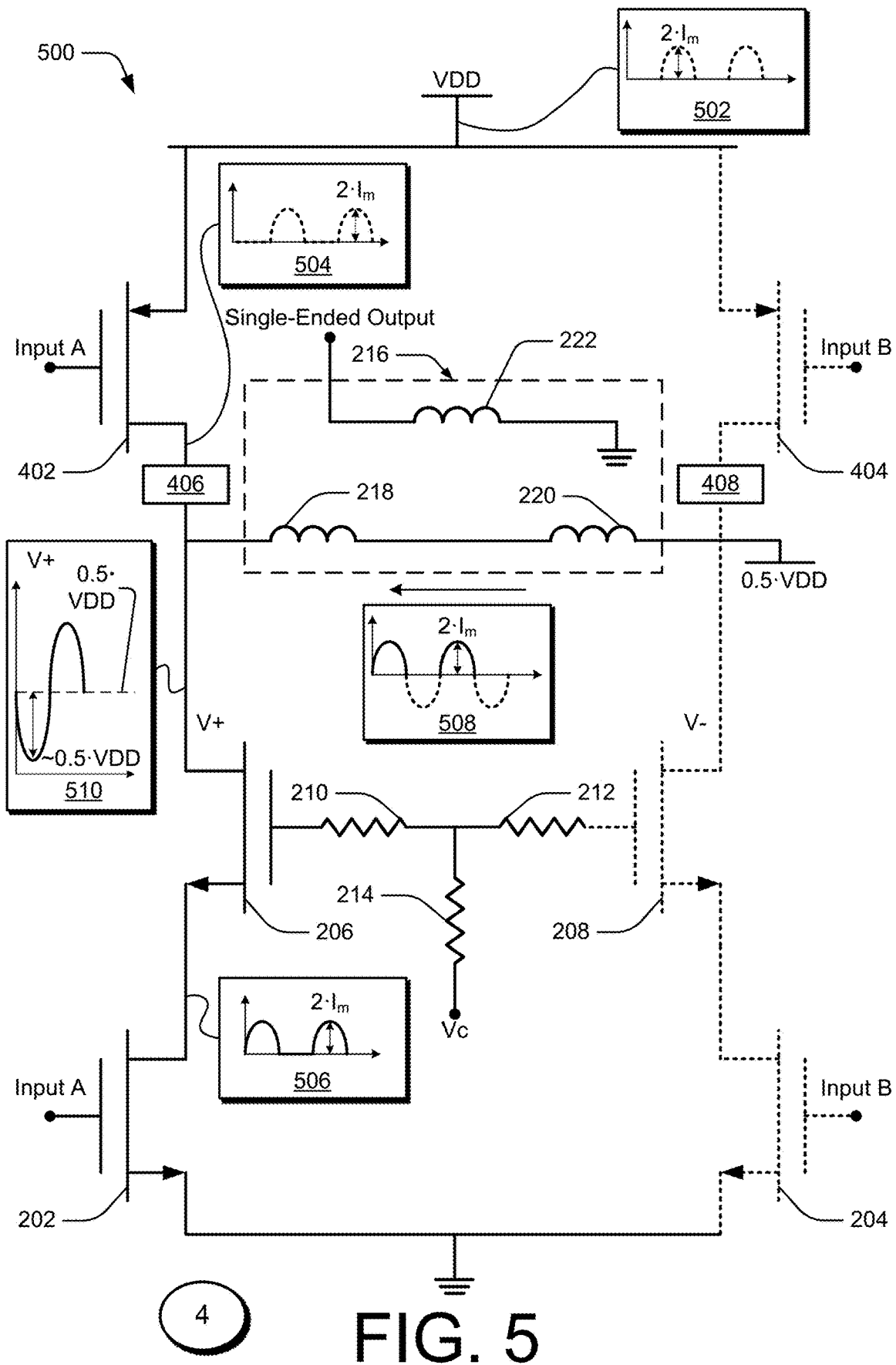
FIG. 5 illustrates, from a voltage and current perspective, an example amplifier in a fourth circuit configuration in accordance with one or more aspects of the disclosure.

FIG. 5 illustrates an example fourth amplifier configuration 500 in accordance with one or more aspects of the disclosure. The example fourth amplifier configuration 500 is an example configuration of the differential amplifier 104 in FIG. 1. A circuit for the example fourth amplifier configuration 500 includes the input transistor 202, the amplifier transistor 206, and the complementary transistor 402 in an active mode or enabled state as described with respect to FIG. 4. However, unlike the configuration depicted in FIG. 4, the example fourth amplifier configuration 500 in FIG. 5 disables one side of the differential amplifier by disabling one transistor of each pair of transistors in a manner analogous to that described for the second amplifier configuration 300 of FIG. 3. For instance, the input transistor 204, the amplifier transistor 208, and the complementary transistor 404 are illustrated in FIG. 5 with dashed lines to denote that amplifier configuration circuitry disables the input transistor 204, the amplifier transistor 208, and the complementary transistor 404 to operationally decouple them from the example amplifier circuit. The amplifier configuration circuitry includes the switches 406 and 408 that selectively connect and disconnect the complementary transistors 402 and 404 from the amplifier and input transistors. The amplifier configuration circuitry may also include other like switches (not shown) and control signals or control voltages (e.g., the control voltage $V_c$) for setting appropriate bias voltages in the example fourth amplifier configuration 500.

Further, although the negative or minus side of the example fourth amplifier configuration 500 is illustrated in FIG. 5 as being disabled, the positive or plus side can alternatively be disabled. The plus side can be disabled by, for example, operationally disconnecting the input transistor 202, the amplifier transistor 206, and the complementary transistor 402 from the example amplifier circuit, instead of the input transistor 204, the amplifier transistor 208, and the complementary transistor 404.

The current provided by the supply voltage $V_{DD}$ is illustrated in an inlay 502. As illustrated by inlay 502, because one side of the differential amplifier is disabled, one phase of the current is omitted, while the other phase remains. Inlays 504 and 506 show the current at the drains of the complementary transistor 402 and the input transistor 202, respectively. However, because the transistors on the minus side of the example fourth amplifier configuration 500 are disabled, their current is substantially zero and thus no inlays are shown in FIG. 5 for the minus side of the example amplifier circuit. The differential current flowing through the amplifier transistor 206 retains a value of $2 \cdot I_m$ current units as indicated in inlay 508 (e.g., the fundamental component of the Fourier transform of the current has a value of $2 \cdot I_m$).

Moreover, the supply voltage $0.5 \cdot V_{DD}$ in the example fourth amplifier configuration 500 in FIG. 5 is connected to a different end of the inductor 220—e.g., at an external node of the differential-to-single-ended converter 216 (which is also referred to herein as the minus amplifier node), instead of at an internal node between the inductor 220 and the inductor 218, as shown in FIG. 4. Based on the supply voltage being set this way, the component of the output voltage $V^+$ is centered at approximately half the supply voltage, or $0.5 \cdot V_{DD}$. Neglecting the saturation voltage of the amplifier transistor 206, the output voltage $V^+$ has a peak voltage (e.g., voltage swing) of approximately half the supply voltage, or $0.5 \cdot V_{DD}$, as illustrated in inlay 510. The peak of the differential voltage, $V^+-V^-$, is therefore:

$$V_{diff,pk} = 0.5 \cdot V_{DD}.$$

Consequently, the "desired" impedance of the load line for the fourth amplifier configuration 500 is:

$$\frac{0.5 \cdot V_{DD}}{2 \cdot I_m} = R/8.$$

This R/8 impedance is the desired impedance because it is the ratio of the peak of the differential voltage to the differential current flowing in the example amplifier circuit for the fourth amplifier configuration 500.

Although the desired impedance of the load line is R/8 for this fourth amplifier configuration, the amplifier transistors 206 and 208 are designed and built to provide a load line impedance of R. Accordingly, the amplifier circuit configured according to FIG. 5 "sees" an impedance of the load line that is eight times what is "expected." Thus, the current can be reduced by $\sqrt{8}$ for the same power as compared to the example first amplifier configuration 200 in FIG. 2.

Accordingly, the example circuits described can avoid including output matching networks or other hardware (e.g., transformers, inductors, capacitors, phase shifters, or quarter-wave transmission lines) to modulate the impedance of a load line in an amplifier. Instead, complementary transistors and amplifier configuration circuitry (e.g., switches) are added to an amplifier circuit to enable reconfigurability, and these components consume relatively low power and do not need to change the implemented impedance of the load line. Rather, the amplifiers and amplifier configurations described herein operate to modulate the effective impedance of the load line by reconfiguring current so that the "expected" load line impedance in the modified amplifier configuration is less than the actual load line impedance implemented in the amplifier. No inductors, capacitors, matching networks, or transformers need to be added to the amplifier circuit to modulate the effective impedance of the load line by reconfiguring current, unlike with existing approaches. Thus, in some aspects, the example circuits described herein modulate the effective impedance of the load line without modifying the amplifier transistors 206 and 208. Furthermore, the low-power complementary transistors and the devices of the amplifier configuration circuitry can scale with semiconductor geometry (e.g., they follow Moore's Law), and they therefore consume relatively little chip area as compared to EM components. Consequently, the example circuits described herein are well-suited for implementations in mobile devices that place a premium on small size and low power consumption. Hence, the example circuits described herein can save power without relying on output matching networks or other costly hardware to modulate the impedance of a load line in an amplifier.

Configurable Amplifier from a Circuit Perspective

Figure 6:
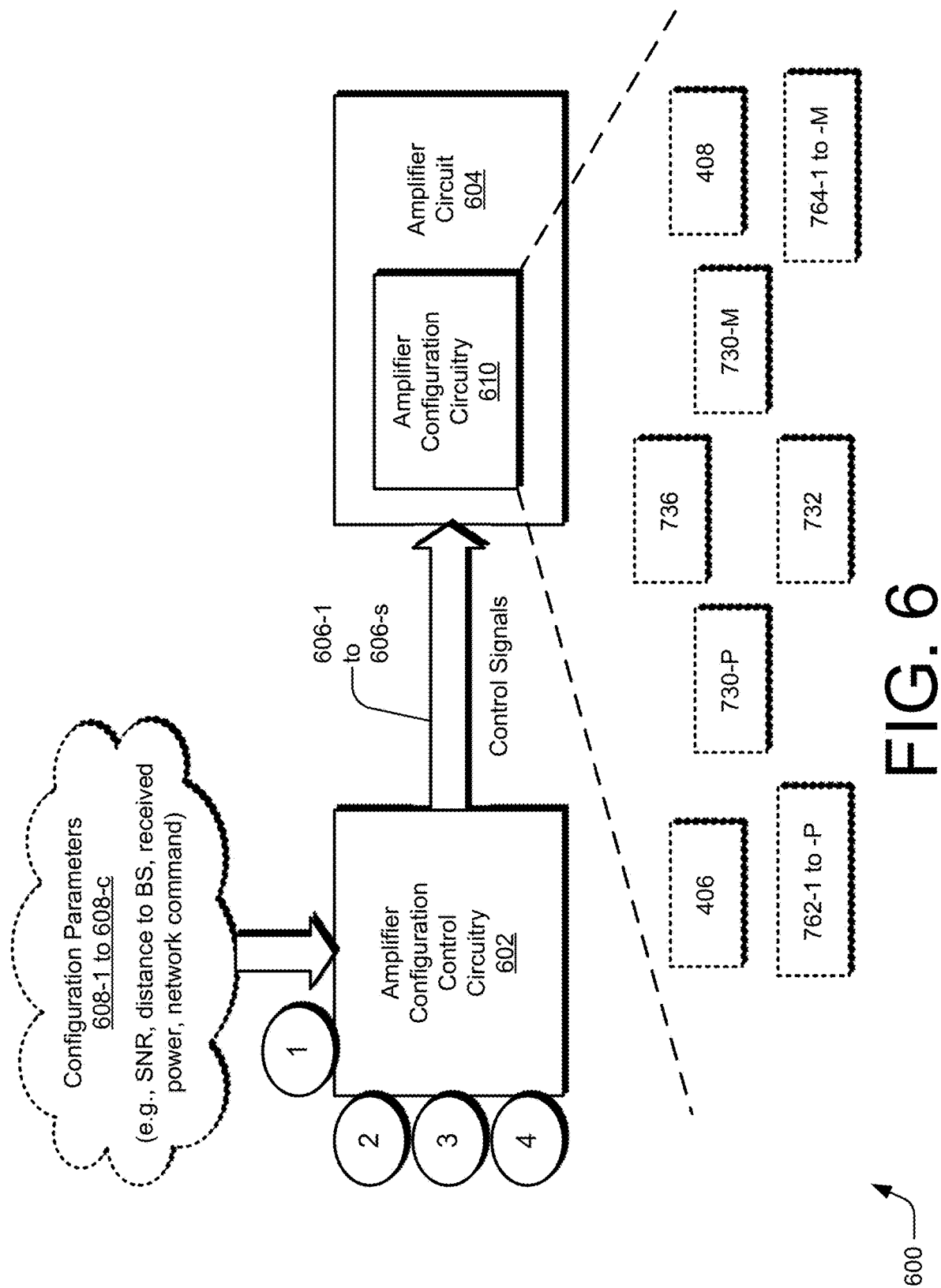
FIG. 6 illustrates an example system in which an amplifier can be operated in different configurations responsive to one or more control signals in accordance with one or more aspects of the disclosure.

FIG. 6 illustrates an example system 600 in which an amplifier can be operated in accordance with one or more aspects of the disclosure. As shown, the system 600 includes amplifier configuration control circuitry 602 and an amplifier circuit 604, which can realize the differential amplifier 104 of FIG. 1. The amplifier circuit 604 includes amplifier configuration circuitry 610. In example implementations, the amplifier configuration circuitry 610 includes one or more configuration switches. Such configuration switches can include the switches 406 and 408 (as well as the switch 236) that are described above. Further, such configuration switches of the amplifier configuration circuitry 610 can include switches 730, 732, 736, 762, and/or 764. These configuration switches are described below starting with FIG. 7.

In operation, the amplifier configuration control circuitry 602 controls the amplifier circuit 604 to enter or activate an amplifier configuration of multiple different amplifier configurations (e.g., the encircled 1, 2, 3, and 4 for the first, second, third, and fourth amplifier configurations, respectively). To cause the amplifier circuit 604 to activate a particular amplifier configuration, the amplifier configuration control circuitry 602 provides one or more control signals 606-1 to 606-$s$ to the amplifier configuration circuitry 610 of the amplifier circuit 604, with "s" representing a positive integer. The one or more control signals 606-1 to 606-$s$ can cause, for example, configuration switches to operate such that the switches are opened, closed, etc. so that currents are prevented from flowing or permitted to flow, respectively. Thus, a control signal 606 can be coupled, for instance, to a gate terminal of an FET that is configured as a switch. The control signal 606 can cause the FET switch to have an open state or a closed state by turning the FET off or on, respectively. Examples of configuration switches of the amplifier configuration circuitry 610 are shown in the lower portion of FIG. 6 and correspond to, for instance, switches depicted in FIGS. 7-11.

The amplifier configuration control circuitry 602 can generate the multiple control signals 606-1 to 606-$s$ based on one or more of multiple configuration parameters 608-1 to 608-$c$, with "c" representing a positive integer. Examples of a configuration parameter 608 include a signal-to-noise ratio (SNR), a distance to a base station (or other wireless device party to a wireless communication), a received power, a bit error rate (BER), beamforming usage, a present bandwidth versus a targeted bandwidth, a network command, and combinations thereof. For instance, responsive to a distance to a base station, the amplifier configuration control circuitry 602 can generate at least one control signal 606 to establish states of the configuration switches of the amplifier configuration circuitry 610. Accordingly, power usage can be reduced as the distance to the base station decreases—e.g., by progressing through the first to the fourth example amplifier configurations as a computing device approaches a base station.

The amplifier configuration control circuitry 602 can include at least one processor and computer-readable storage media (CRSM), which stores computer-executable instructions. The processor and the CRSM can be localized at one module or one integrated circuit chip or can be distributed across multiple modules or chips of an electronic device. Together, a processor and associated instructions can be realized in separate circuitry, fixed logic circuitry, hard-coded logic, and so forth. The amplifier configuration control circuitry 602 can be implemented as part of the wireless interface 112, the communication processor 116, logic of the wireless transceiver 114, a general-purpose processor, some combination thereof, and so forth.

FIG. 7 illustrates, from a circuit perspective, an example amplifier circuit 604 that is configurable in accordance with one or more aspects of the disclosure into different configurations using one or more switches. The amplifier circuit 604 includes some components described above with reference to FIGS. 2-5 and 6. The amplifier circuit 604 also includes other components as described below. The amplifier circuit 604 is depicted and described in terms of a differential amplifier having plus components and minus components that are complimentary thereto. However, the amplifier circuit 604 can also be configured to operate as a non-differential amplifier as described below. Although certain components, functionalities, or configurations may be described in terms of one complementary part or the other (e.g., described with minus components but not plus components), such aspects are also applicable to the other complementary part (e.g., to the plus components) for the plus and minus designations are arbitrary with respect to each other. Thus, if a minus part is described as being operational for a particular configuration but a plus part is disconnected and not operational for that configuration, the amplifier circuit 604 may also be operated with the plus part being operational but the minus part being disconnected and nonoperational.

In example implementations, the amplifier circuit 604 includes a plus input node 742, a minus input node 744, a plus amplifier node 702, and a minus amplifier node 704. With reference also to FIGS. 2 and 4, the amplifier circuit 604 also includes the differential-to-single-ended converter 216 and the switches 406 and 408 (e.g., a plus switch 406 and a minus switch 408). The amplifier circuit 604 further includes a plus array of transistors 752 and a minus array of transistors 754. The plus array of transistors 752 is coupled to the plus amplifier node 702 and the plus input node 742. The plus array of transistors 752 includes multiple plus transistor stacks 756-1 to 756-P, with "P" representing a positive integer and with two plus transistor stacks (756-1 and 756-P) being explicitly indicated. Similarly, the minus array of transistors 754 is coupled to the minus amplifier node 704 and the minus input node 744. The minus array of transistors 754 includes multiple minus transistor stacks 758-1 to 758-M, with "M" representing a positive integer and with two minus transistor stacks (758-1 and 758-M) being explicitly indicated. Generally, each input transistor can also be called a first transistor, and each amplifier transistor can also be called a cascode or second transistor.

The amplifier circuit 604 also includes at least one inductor 738 coupled between the plus amplifier node 702 and the minus amplifier node 704. The inductor 738 can include the inductors 218 and 220. The inductor 738 also includes (e.g., has or is associated with) an inter-inductor node 734 that is disposed between the inductors 218 and 220. Thus, the inter-inductor node 734 can be positioned between two inductors or along one inductor (e.g., like a central tap node). The amplifier circuit 604 further includes a minus power switch 730-M, a plus power switch 730-P, and an inductor power switch 736. The minus power switch 730-M is coupled between the minus amplifier node 704 and one or more supply voltages (e.g., V1, V2, or V3). The inductor power switch 736 is coupled between the inter-inductor node 734 and at least one supply voltage (e.g., V1, V2, or V3). The plus power switch 730-P is coupled between the plus amplifier node 702 and one or more supply voltages (e.g., V1, V2, or V3).

As shown, each plus transistor stack 756 includes a plus input transistor 202 coupled in series with a plus amplifier transistor 206, and each minus transistor stack 758 includes a minus input transistor 204 coupled in series with a minus amplifier transistor 208. Thus, there are P plus input transistors and P plus amplifier transistors (202-1 ... 202-P and 206-1 ... 206-P, respectively) across the plus array of transistors 752. Similarly, there are M minus input transistors and M minus amplifier transistors (204-1 ... 204-M and 208-1 ... 208-M, respectively) across the minus array of transistors 754. Here, "P" and "M" are positive integers that may be the same or different (e.g., 4, 8, 11, or 16).

Each of the multiple plus input transistors 202-1 to 202-P is coupled at a respective gate terminal thereof to the plus input node 742 and at a respective source terminal thereof to an equipotential node 724, such as ground. Each of the multiple minus input transistors 204-1 to 204-M is coupled at a respective gate terminal thereof to the minus input node 744 and at a respective source terminal thereof to the equipotential node 724.

For a cascode amplifier configuration, each of the multiple plus amplifier transistors 206-1 to 206-P is coupled at a respective gate terminal thereof to bias resistors 210/212/214 and at a respective drain terminal thereof to the plus amplifier node 702. Each of the multiple plus amplifier transistors 206-1 to 206-P is also coupled at a respective source terminal thereof to a respective drain terminal of the multiple plus input transistors 202-1 to 202-P. Similarly, each of the multiple minus amplifier transistors 208-1 to 208-M is coupled at a respective gate terminal thereof to the bias resistors 210/212/214 and at a respective drain terminal thereof to the minus amplifier node 704. Each of the multiple minus amplifier transistors 208-1 to 208-M is also coupled at a respective source terminal thereof to a respective drain terminal of the multiple minus input transistors 204-1 to 204-M. The bias resistors 210/212/214 are coupled to a bias voltage switch 732, which can bias the gate terminals at one of two or more power supplies having different voltage levels.

As shown, the bias voltage switch 732 is coupled between (i) the plus array of transistors 752 and the minus array of transistors 754 and (ii) multiple supply voltages (e.g., V3 or Vcasc). The bias voltage switch 732 is coupled to multiple gates of multiple plus amplifier transistors 206-1 to 206-P of the plus array of transistors 752 and to multiple gates of multiple minus amplifier transistors 208-1 to 208-M of the minus array of transistors 754. Responsive to a control signal 606 received from the amplifier configuration control circuitry 602 of FIG. 6, the bias voltage switch 732 therefore biases the plus and minus amplifier transistors (e.g., to turn the amplifier transistors off, partially on, or fully on).

As shown, the plus switch 406 can include a switch transistor 716, and the minus switch 408 can include a switch transistor 718. The amplifier transistors 206-1 to 206-P and 208-1 to 208-M and the switch transistors in the plus switch 406 and the minus switch 408 are depicted with a thicker line as compared to other transistors (e.g., the input transistors 202-1 to 202-P and 204-1 to 204-M). This thicker line indicates a thicker oxide layer is present as compared to other transistors, such as the input transistors. The oxide functions as the dielectric layer between a gate terminal and the channel Thus, transistors with a thicker oxide layer can operate with or withstand a higher voltage. For the example amplifier circuit 604, the transistors that may be coupled directly to the at least one inductor 738 include the thicker oxide layer to handle higher voltage level swings that can be generated as currents flow through the first and second inductors 218 and 220.

In some implementations, individual stacks or groups of stacks of transistors can be enabled or disabled to affect current flow. For example, each respective plus transistor stack 756 can include a respective plus transistor switch 762 (of multiple plus transistor switches 762-1 to 762-P distributed along the plus array of transistors 752) configured to enable or disable the respective plus transistor stack 756. Similarly, each respective minus transistor stack 758 includes a respective minus transistor switch 764 (of multiple minus transistor switches 764-1 to 764-M distributed along the minus array of transistors 754) configured to enable or disable the respective minus transistor stack 758. The respective transistor switch 762 or 764 in a respective transistor stack of a given transistor array can be located anywhere along the respective transistor stack, as indicated by the dashed-line boxes in FIG. 7 that are representative of the plus and minus transistor switches. For example, the transistor switch 762 or 764 can be positioned between a respective amplifier transistor 206 or 208 and a respective input transistor 202 or 204, or the transistor switch 762 or 764 can be coupled on either side of the amplifier transistor or the input transistor. For instance, the plus transistor switch 762-1 can be coupled to a drain terminal of the plus amplifier transistor 206-1 or between the source terminal of the plus input transistor 202-1 and the equipotential node 724. To enable or disable a given transistor stack, the corresponding transistor switch 762 or 764 is turned on or turned off, respectively. Also, another example of a transistor switch 762 or 764 is provided as the switch 236 illustrated in FIGS. 2 and 3.

As shown, the at least one inductor 738 includes a plus inductor 218 and a minus inductor 220 coupled together in series between the plus amplifier node 702 and the minus amplifier node 704. The inter-inductor node 734 is disposed between the plus inductor 218 and the minus inductor 220. Thus, the at least one inductor 738 can be implemented as two separate inductors that are coupled to the inter-inductor node 734. Alternatively, the at least one inductor 738 can be implemented as one inductor in which the inter-inductor node 734 is realized as a tap node.

In some implementations, the inductor power switch 736 is coupled between the inter-inductor node 734 and multiple supply voltages (e.g., V1, V2, or V3). Thus, the inductor power switch 736 is configured to connect the inter-inductor node 734 to the at least one supply voltage (e.g., V1, V2, or V3) or to disconnect the inter-inductor node 734 from the at least one supply voltage. Examples of supply voltage levels include 0.5 V, 1.0 V, and 1.8 V, but other voltages may be used. The inductor power switch 736 can include at least one transistor for each respective supply voltage level (e.g., with each transistor coupled to a different power supply rail or to a stepped-down voltage from a power supply rail). Closing a switch connects to power, and opening a switch disconnects from power. To connect the inter-inductor node 734 to a particular supply voltage (e.g., V2), a corresponding transistor of the inductor power switch 736 is turned on, and other transistors thereof (e.g., corresponding to V1 and V3) are turned off. In other aspects, the inductor power switch 736 may be configured to disconnect the inter-inductor node 734 from the at least one supply voltage and enable a voltage of the inter-inductor node 734 to fluctuate (e.g., rise or fall as current flows through the inductor 738, or float).

The amplifier circuit 604 can also include a minus complementary transistor 404 coupled between the minus amplifier node 704 and the minus input node 744. To connect the minus complementary transistor 404 to the minus transistor array 754, the amplifier circuit 604 can further include a minus switch 408 coupled between the minus complementary transistor 404 and the minus array of transistors 754 via the minus amplifier node 704. Analogously, the amplifier circuit 604 may additionally include a plus complementary transistor 402 and a plus switch 406 for the plus transistor array 752. The plus complementary transistor 402 is coupled between the plus amplifier node 702 and the plus input node 742. The plus switch 406 is coupled between the plus complementary transistor 402 and the plus array of transistors 752 via the plus amplifier node 702.

For different configurations, the minus power switch 730-M is configured to connect the minus amplifier node 704 to at least one of the one or more supply voltages (e.g., V1, V2, or V3) or to none of the one or more supply voltages (e.g., V1, V2, or V3). The minus power switch 730-M can include one switch (e.g., one transistor) per supply voltage. The connection can be accomplished by closing one switch of the minus power switch 730-M and opening others. The disconnection can be accomplished by opening each of the switches of the minus power switch 730-M. Similarly, for different configurations, the plus power switch 730-P is configured to connect the plus amplifier node 702 to at least one of the one or more supply voltages (e.g., V1, V2, or V3) or to none of the one or more supply voltages (e.g., V1, V2, or V3). Although certain specific supply voltages are depicted in FIG. 7, different power switches may be capable of connecting to different supply voltages. For instance, the supply voltages for the inductor power switch 736 may have at least one different supply voltage than the plus or minus power switches 730-P or 730-M, and similarly for the plus and minus power switches 730-P and 730-M with respect to each other (e.g., a particular power switch may be able to couple to a voltage V4, even if other switches cannot).

The amplifier circuit 604 can further include one or more variable capacitors, one or more bias resistors (e.g., R1, R2, R3, and R4), one or more coupling capacitors (e.g., C1, C2, C3, and C4.) one or more switches, and so forth. As illustrated, a plus variable capacitor 710 and a minus variable capacitor 712 are coupled together in series between the plus amplifier node 702 and the minus amplifier node 704. Each variable capacitor can be implemented as a varactor, as an array or switchable bank of capacitors, and so forth. Also, a switch 714 is coupled between the plus complementary transistor 402 and the minus complementary transistor 404 at gate terminals thereof and can be used to initialize these two transistors. Further, a switch 726 is coupled between a drain of the plus complementary transistor 402 and a gate thereof, and a switch 728 is coupled between a drain of the minus complementary transistor 404 and a gate thereof. Further, the bias resistors R1 and R2 can establish a bias voltage on gate terminals of the input transistors. Example component values are approximately 22 kilo-ohms for the bias resistors R1 and R2 and 0.4 V on the bias node between the two resistors; however, other values can be used instead. These switches, variable capacitors, coupling capacitors, and bias resistors can provide a bias voltage, can implement a bypass mode, can facilitate initialization, and so forth. However, such components can be rearranged, augmented, or omitted in other implementations.

Generally, each switch can be implemented using, for example, at least one transistor. The plus switch 406 incudes a switch transistor 716 and a resistor 720 that is coupled to a power switch (e.g., for V0 or V3). This power switch can bias the switch transistor 716 in an ON state (V3) or an OFF state (V0) for a CLOSED switch state or an OPEN switch state, respectively. The minus switch 408 incudes a switch transistor 718 and a resistor 722 that is coupled to a power switch (e.g., for V0 or V3). The power switch can bias the switch transistor 718 in an ON transistor state (V3) or an OFF transistor state (V0) for a CLOSED switch state or an OPEN switch state, respectively.

The transistors of the transistor stacks (e.g., a plus transistor stack 756 or a minus transistor stack 758) can be implemented in various manners. For example, the transistors can each have similar widths to provide similar amounts of current. Alternatively, the transistors can have different widths to provide a greater range of different current amounts. For instance, the transistors can be implemented using binary-weighted transistors (BWT) to achieve different widths for conducting current. Example BWT implementations include: (1) eight transistors each with a width of 1×; (2) four transistors with widths of 8×, 4×, 2×, and 1×; or (3) four transistors with widths of 4×, 2×, 1×, and 1×. With any of these examples, effective widths that are achievable include 1×, 2×, 4×, and 8× using control signals that appropriately control the multiple plus transistor switches 762-1 to 762-P and the multiple minus transistor switches 764-1 to 764-M. By turning these transistor switches of the transistor stacks ON and OFF, the effective transistor width—and resulting current flow—can be modulated (e.g., increased or decreased) for different configurations.

Configurable Amplifier from a Circuit Control Perspective

FIGS. 8, 9, 10, and 11 illustrate different example switch states of the switches of the amplifier circuit 604 of FIG. 7 to implement example first, second, third, and fourth configurations, respectively. Generally, states of switches (e.g., OPEN vs. CLOSED), connection states for couplings (e.g., connected to a voltage or not), transistor states (e.g., ON vs.

OFF or enable vs. disable for individual transistors or transistor stacks), and combinations thereof are depicted. In some aspects, the voltages V1, V2, and V3 respectively correspond to low, medium, and high voltage levels. Further, the voltage V1 can be approximately half the voltage V2. Further, with regard to biasing the multiple plus amplifier transistors 206-1 to 206-P and the multiple minus amplifier transistors 208-1 to 208-M, the bias voltage switch 732 can couple Vcasc to each gate terminal to at least partially turn on each transistor.

In each of the FIGS. 8, 9, 10, and 11, whether or how many transistor stacks of the plus array of transistors 752 and the minus array of transistors 754 are turned on is indicated using a "check" mark or an "X" mark for ON and OFF, respectively. In some aspects, the four illustrated marks can represent an example number of transistors that is a power of four, such as 4, 8, or 16. Thus, each mark can correspond to one, two, or four transistors, or relative width or portion across the associated array of transistors. Each mark can therefore represent a quarter portion of the array of transistors. For clarity and simplicity, however, each array is assumed to have four transistor stacks in FIGS. 8-11.

Also, whether the inductor power switch 736 is coupling the at least one inductor 738 (e.g., at the inter-inductor node 734) to a supply voltage is indicated at the top middle of each drawing. Further, if at least one of the power switches (e.g., the plus power switch 730-P or the minus power switch 730-M) is coupling a voltage supply to a respective amplifier node (e.g., the plus amplifier node 702 or the minus amplifier node 704, respectively) is indicated for each of the four configurations. Additionally, whether the plus switch 406 or the minus switch 408 is closed or opened is depicted by showing whether a bias voltage for the transistor is coupled to a voltage level that turns the transistor ON or OFF for CLOSED or OPEN switches, respectively. This illustrates whether the associated complementary transistor (e.g., the plus complementary transistor 402 or the minus complementary transistor 404, respectively) is activated or deactivated for a given configuration.

Figure 8:
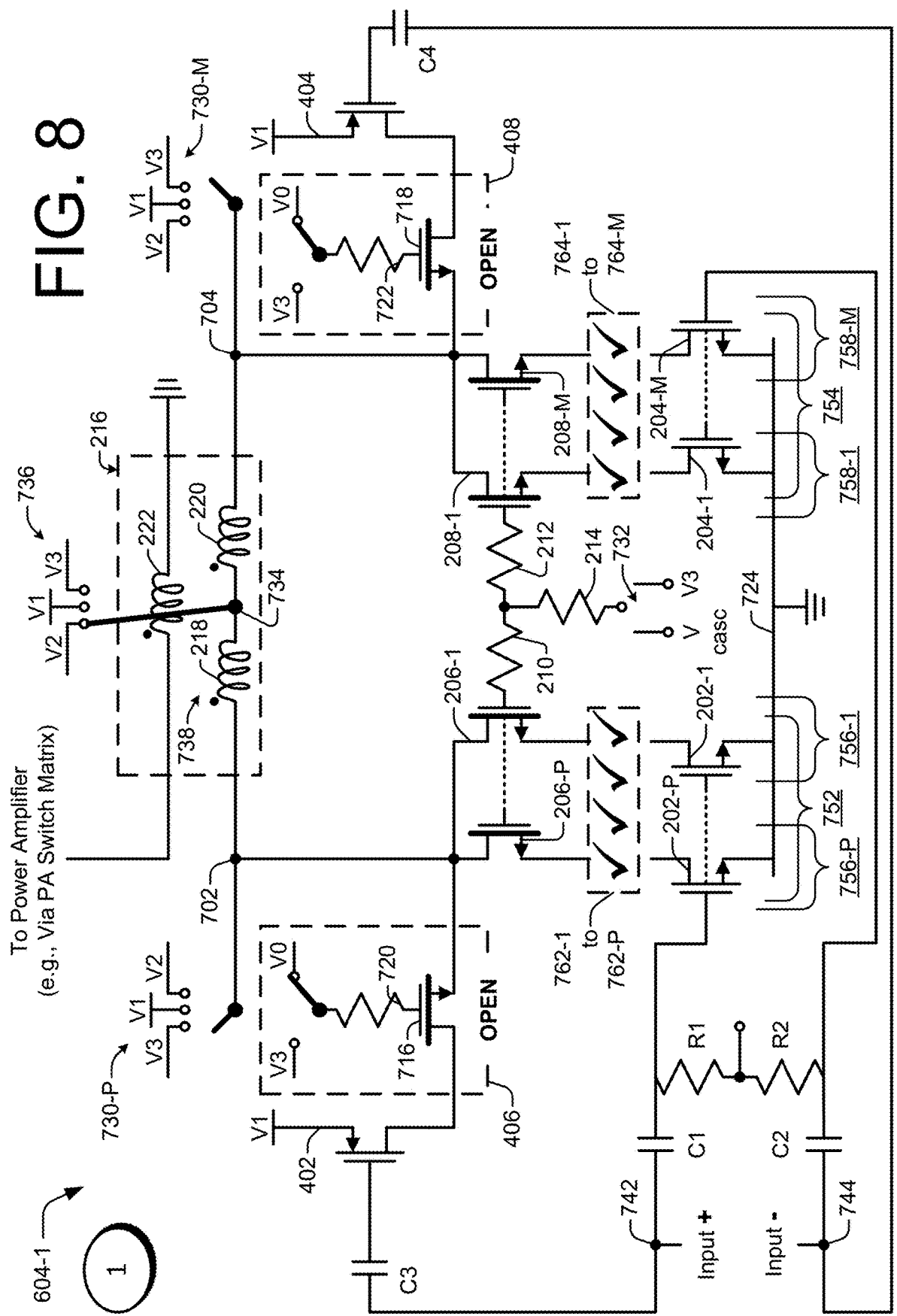
FIG. 8 illustrates, from a circuit control perspective, an example amplifier circuit in the first amplifier configuration in accordance with one or more aspects of the disclosure.

FIG. 8 illustrates, from a circuit control perspective, an example amplifier circuit 604-1 in a first amplifier configuration in accordance with one or more aspects of the disclosure. This first amplifier configuration corresponds to the first amplifier configuration 200 of FIG. 2. Here, power is at a highest level of the four amplifier configurations, such as if a device is relatively far from a base station. Accordingly, each of the four stacks (four in these example implementations) of the multiple plus transistor stacks 756-1 to 756-P and the multiple minus transistor stacks 758-1 to 758-M are enabled. This enabling or disabling of the transistor stacks can be performed by the multiple plus transistor switches 762-1 to 762-P and the multiple minus transistor switches 764-1 to 764-M. The plus switch 406 and the minus switch 408 are both open ("OPEN") as evidenced by the corresponding bias voltage being set to a low voltage (V0) to disconnect and thereby deactivate the plus complementary transistor 402 and the minus complementary transistor 404, respectively.

For the first amplifier configuration, the plus power switch 730-P and the minus power switch 730-M are not connected to a supply voltage. In contrast, the inductor power switch 736 is connected to a supply voltage. For example, the inductor power switch 736 can connect the inter-inductor node 734 to a medium voltage V2 (e.g., $V_{DD}$). With these switch positions of the amplifier configuration circuitry 610 (of FIG. 6), as controlled by the amplifier configuration control circuitry 602, the amplifier circuit 604-1 can produce voltages and currents as described above with reference to the first amplifier configuration 200 of FIG. 2. Thus, the load line impedance of "R" is established with the resulting reconfigured currents.

Figure 9:
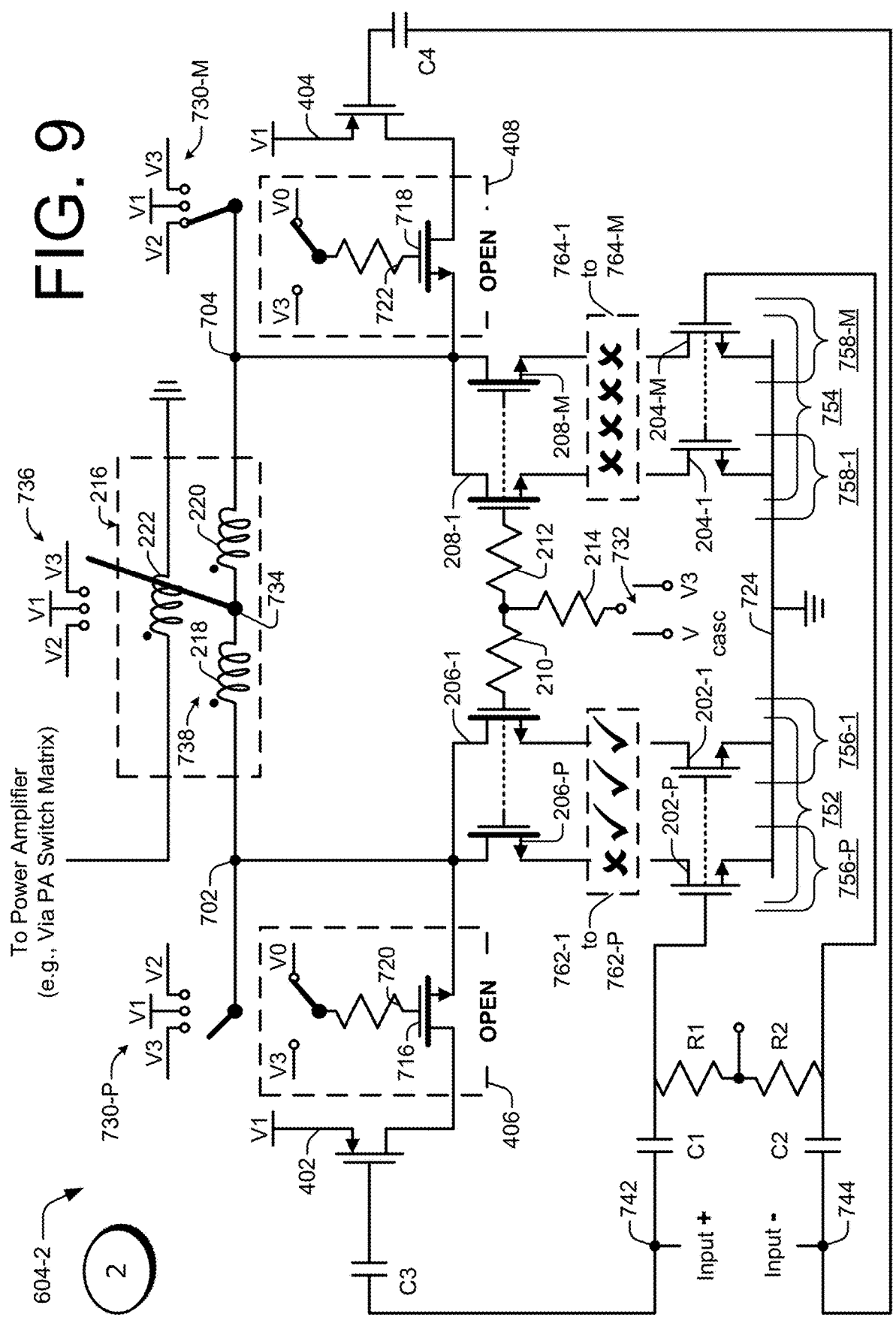
FIG. 9 illustrates, from a circuit control perspective, an example amplifier circuit in the second amplifier configuration in accordance with one or more aspects of the disclosure.

FIG. 9 illustrates, from a circuit control perspective, an example amplifier circuit 604-2 in the second amplifier configuration in accordance with one or more aspects of the disclosure. This second amplifier configuration corresponds to the second amplifier configuration 300 of FIG. 3. Here, power is a notch below the highest level of the four amplifier configurations, such as if the device has moved closer to the base station. Accordingly, three of the four stacks of the multiple plus transistor stacks 756-1 to 756-P are enabled, and one is disabled. For the second amplifier configuration, one side of the amplifier circuit 604-2 is disabled, as shown in FIG. 3. In this example, the minus side is disabled; however, the plus side can be equivalently disabled. To disable the minus side, each of the multiple minus transistor stacks 758-1 to 758-M are disabled, as indicated by the "X" marks. The plus switch 406 and the minus switch 408 are both open ("OPEN") as evidenced by the bias voltage being set to a low voltage (V0) to disconnect and thereby deactivate the plus complementary transistor 402 and the minus complementary transistor 404, respectively.

For the second amplifier configuration, the plus power switch 730-P is not connected to a supply voltage. However, the minus power switch 730-M is connected to a supply voltage, such as V2, to "counterbalance" the disabled transistor stacks. In contrast, the inductor power switch 736 is disconnected from a supply voltage. With these switch positions of the amplifier configuration circuitry 610 (of FIG. 6), as controlled by the amplifier configuration control circuitry 602, the amplifier circuit 604-2 can produce voltages and currents as described above with reference to the second amplifier configuration 300 of FIG. 3. Thus, the load line impedance of "R/2" is established with the resulting reconfigured currents.

Figure 10:
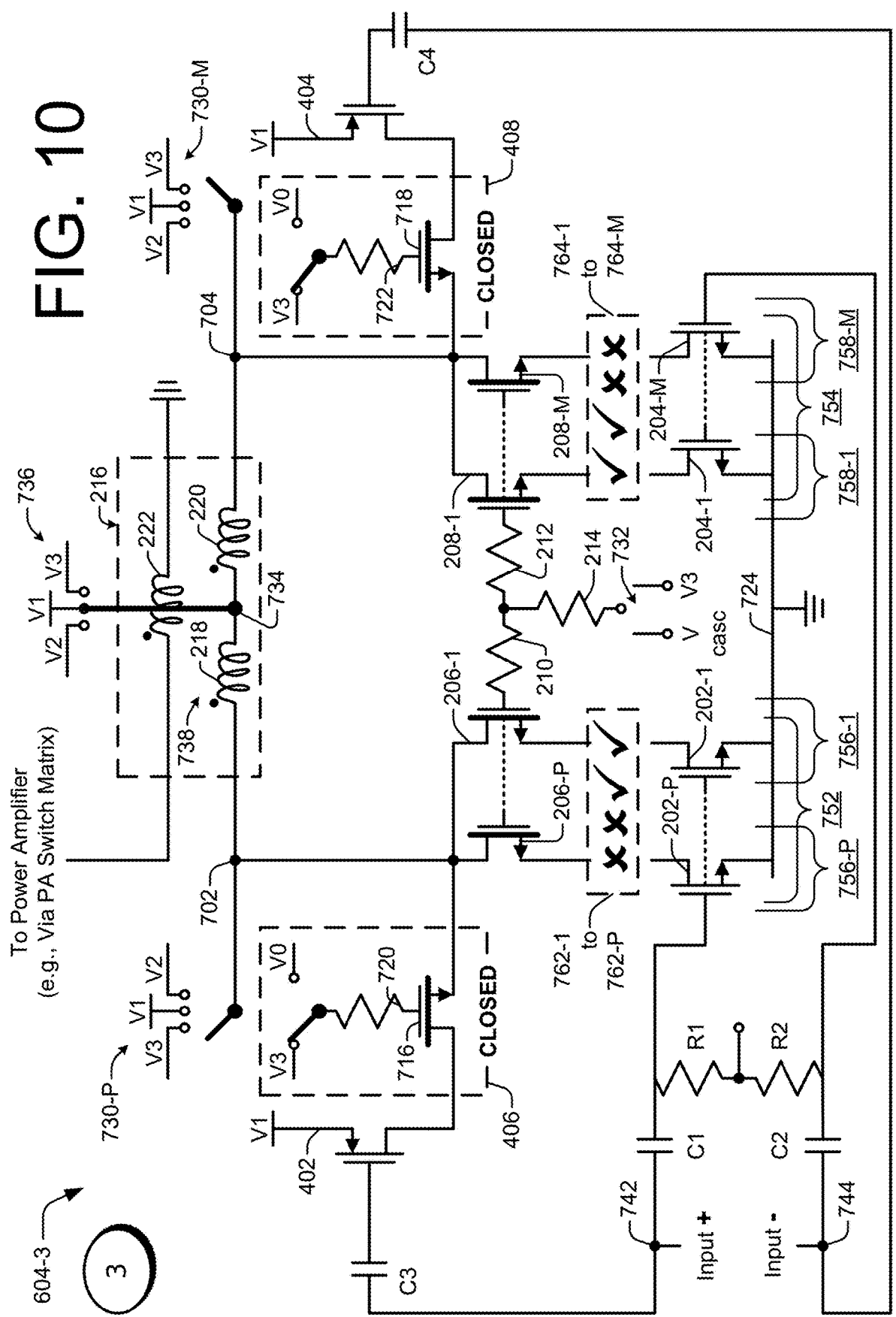
FIG. 10 illustrates, from a circuit control perspective, an example amplifier circuit in the third amplifier configuration in accordance with one or more aspects of the disclosure.

FIG. 10 illustrates, from a circuit control perspective, an example amplifier circuit 604-3 in the third amplifier configuration in accordance with one or more aspects of the disclosure. This third amplifier configuration corresponds to the third amplifier configuration 300 of FIG. 3. Here, power is two notches below the highest level of the four amplifier configurations, such as if the device is even closer to the base station. Accordingly, two of the four stacks (four in these example implementations) of both the multiple plus transistor stacks 756-1 to 756-P and the multiple minus transistor stacks 758-1 to 758-M are enabled. This enabling or disabling of the transistor stacks can be performed by the multiple plus transistor switches 762-1 to 762-P and the multiple minus transistor switches 764-1 to 764-M. The enabling and disabling is indicated with two "check" marks and two "X" marks apiece. The plus switch 406 and the minus switch 408 are both closed ("CLOSED") as evidenced by the bias voltage being set to a high voltage (V3) to connect the plus complementary transistor 402 and the minus complementary transistor 404, respectively, and thereby activate these two transistors for inclusion in the amplification functionality.

For the third amplifier configuration, the plus power switch 730-P and the minus power switch 730-M are not connected to a supply voltage. In contrast, the inductor power switch 736 is connected to a supply voltage. For example, the inductor power switch 736 can connect the inter-inductor node 734 to a low voltage V1 (e.g., $V1=V_{DD}/2$). With these switch positions of the amplifier configuration circuitry 610 (of FIG. 6), as controlled by the amplifier configuration control circuitry 602, the amplifier circuit 604-3 can produce voltages and currents as described above with reference to the third amplifier configuration 400 of FIG. 4. Thus, the load line impedance of "R/4" is established with the resulting reconfigured currents.

Figure 11:
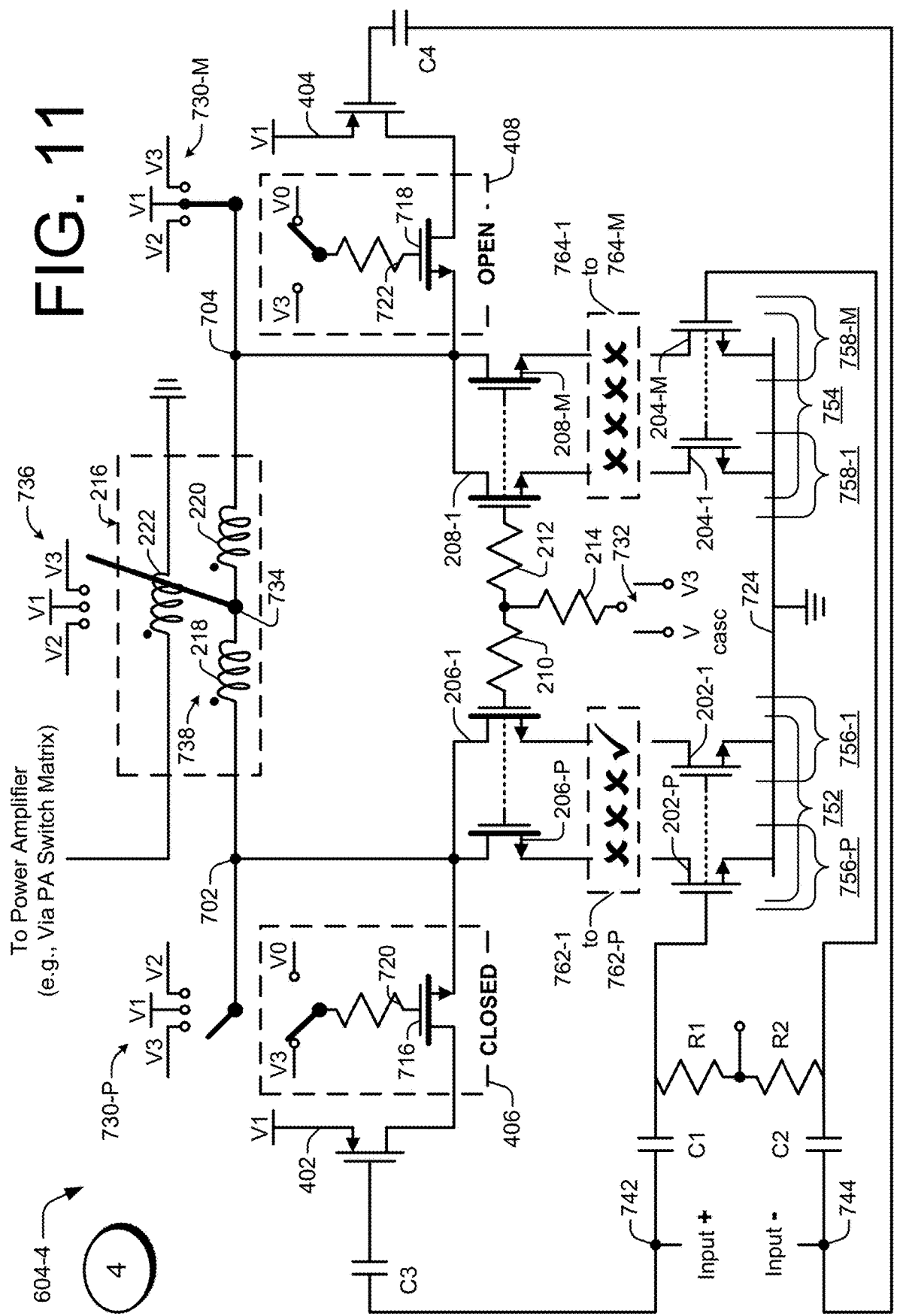
FIG. 11 illustrates, from a circuit control perspective, an example amplifier circuit in the fourth amplifier configuration in accordance with one or more aspects of the disclosure.

FIG. 11 illustrates, from a circuit control perspective, an example amplifier circuit 604-4 in the fourth amplifier configuration in accordance with one or more aspects of the disclosure. This fourth amplifier configuration corresponds to the fourth amplifier configuration 500 of FIG. 5. Here, power is at a lowest level of the four amplifier configurations. Accordingly, one of the four stacks of the multiple plus transistor stacks 756-1 to 756-P is enabled, and three are disabled. For the fourth amplifier configuration, one side of the amplifier circuit 604-4 is disabled, as shown in FIG. 5. In this example, the minus side is disabled; however, the plus side can be equivalently disabled. To disable the minus side, each of the multiple minus transistor stacks 758-1 to 758-M are disabled, as indicated by the "X" marks. The plus switch 406 is closed ("CLOSED") as evidenced by the bias voltage being set to a high voltage (V3) to connect the plus complementary transistor 402 and thereby activate this transistors for inclusion in the amplification functionality. The minus switch 408, on the other hand, is open ("OPEN") as evidenced by the bias voltage being set to a low voltage (V0) to disconnect the minus complementary transistor 404 from the amplification functionality. Alternatively, because the minus side is disabled, the minus switch 408 may be closed ("CLOSED").

For the fourth amplifier configuration, the plus power switch 730-P is not connected to a supply voltage. However, the minus power switch 730-M is connected to a supply voltage, such as V1 (e.g., V$1=V_{DD}/2$), to "counterbalance" the disabled transistor stacks. In contrast, the inductor power switch 736 is disconnected from a supply voltage. With these switch positions of the amplifier configuration circuitry 610 (of FIG. 6), as controlled by the amplifier configuration control circuitry 602, the amplifier circuit 604-4 can produce voltages and currents as described above with reference to the fourth amplifier configuration 500 of FIG. 5. Thus, the load line impedance of "R/8" is established with the resulting reconfigured currents.

Having considered discussions of example amplifier circuits and corresponding amplifier configurations, consider now example procedures in accordance with one or more aspects of the disclosure.

Example Procedures

FIG. 12 illustrates an example procedure 1200 for operating a differential amplifier in accordance with one or more aspects of the disclosure. Aspects of the procedure may be implemented in hardware, firmware, software, or a combination thereof (e.g., to determine the multiple control signals 606-1 to 606-$s$ based on one or more configuration parameters 608-1 to 608-$c$). The procedure is shown as a set of blocks that specify operations performed by one or more devices or components thereof and are not necessarily limited to the orders shown for performing the operations by the respective blocks. In at least some aspects, the procedure may be performed by a suitably configured device or devices, such as the computing device 102 in FIG. 1, or any device including a differential amplifier, such as the example amplifier circuits in FIGS. 2-11.

A voltage supply provides a voltage supply signal to a differential amplifier (block 1202). The differential amplifier includes a first pair of transistors designed for a load line having a first impedance in a first amplifier configuration. The first pair of transistors comprises a pair of amplifier transistors, such as the amplifier transistors 206 and 208 in FIGS. 2-5 and 7-11. In one example, the first impedance is based at least partly on the voltage supply signal. Additionally or alternatively, the first impedance can be based on a voltage other than the voltage supply signal, such as a higher voltage than the voltage supply signal.

Amplifier configuration control circuitry 602 controls amplifier configuration circuitry 610 to configure the differential amplifier in a second amplifier configuration corresponding to the load line having a second impedance (block 1204). The second impedance is lower than the first impedance. In some examples, the second impedance is one-half, one-quarter, or one-eighth of the first impedance. The second amplifier configuration can include no inductors that are not included in the first amplifier configuration.

In one implementation, the amplifier configuration circuitry 610 configures the differential amplifier by disabling one transistor of the first pair of transistors (block 1206). Disabling the transistor of the first pair of transistors can be accomplished, for example, by running the differential amplifier in a single-ended mode using at least one plus transistor switch 762 or at least one minus transistor switch 764.

Additionally or alternatively, in another implementation, the amplifier configuration circuitry 610 configures the differential amplifier by enabling at least one transistor of a second pair of transistors of the differential amplifier (block 1208). The second pair of transistors has a complementary transistor type to the first pair of transistors (e.g., the second pair of transistors is a pair of complementary transistors, such as the complementary transistors 402 and 404 in FIGS. 4-5 and 7-11.). For instance, the first pair of transistors can have an n-channel transistor type, and the second pair of transistors can have a p-channel transistor type.

An enabled transistor of the second pair of transistors has a first terminal coupled to the voltage supply signal and a second terminal coupled to a first terminal of an additional transistor of the first pair of transistors. The enabled transistor of the second pair of transistors has a third terminal coupled to the input signal. In one example, enabling the transistor of the second pair of transistors includes activating a transistor switch coupling the second terminal of the enabled transistor of the second pair of transistors to the first terminal of the additional transistor of the first pair of transistors.

The amplifier configuration circuitry 610 can further configure the differential amplifier by disabling a transistor of the second pair of transistors. Alternatively, the amplifier configuration circuitry 610 can configure the differential amplifier by enabling both transistors of the second pair of transistors. The other enabled transistor of the second pair of transistors has a first terminal coupled to the voltage supply signal, a second terminal coupled to a first terminal of one transistor of the first pair of transistors, and a third terminal coupled to a differential component of the input signal.

In one example, the amplifier configuration circuitry 610, under control of the amplifier configuration control circuitry 602, configures the differential amplifier by both disabling one transistor of the first pair of transistors (as described at block 1206), and enabling at least one transistor of the second pair of transistors of the differential amplifier (as described at block 1208).

The differential amplifier amplifies an input signal with the differential amplifier in the second amplifier configuration with the load line having the first impedance (block 1210). Amplifying the input signal can include biasing, with a voltage supply, a differential-to-single-ended converter on a differential side of the differential-to-single-ended converter with a bias voltage set as half the voltage supply signal. The differential-to-single-ended converter can have a first terminal coupled to the first terminal of the additional transistor of the first pair of transistors and a second terminal coupled to a terminal of said one transistor of the first pair of transistors. The differential amplifier provides the amplified input signal to a single-ended side of the differential-to-single-ended converter to produce a single-ended output signal on a third terminal of the differential-to-single-ended converter.

In one example, the differential amplifier includes a third pair of transistors of a same transistor type as the first pair of transistors. The third pair of transistors comprises a pair of input transistors, such as the input transistors 202 and 204 in FIGS. 2-5 and 7-11. A first transistor of the third pair of transistors has a first terminal coupled to a second terminal of the additional transistor of the first pair of transistors, a second terminal coupled to ground, and a third terminal coupled to a first differential component of the input signal. A second transistor of the third pair of transistors has a first terminal coupled to a second terminal of one transistor of the first pair of transistors, a second terminal coupled to ground, and a third terminal coupled to a second differential component of the input signal. The first differential component of the input signal is coupled to a third terminal of the enabled transistor of the second pair of transistors, and the second differential component of the input signal is coupled to a terminal of another transistor of the second pair of transistors.

In another example, the amplifier configuration circuitry configures the differential amplifier in a single-ended mode by disabling one of the transistors of the first pair of transistors, one of the transistors of the second pair of transistors, and one of the transistors of the third pair of transistors.

Figure 13:
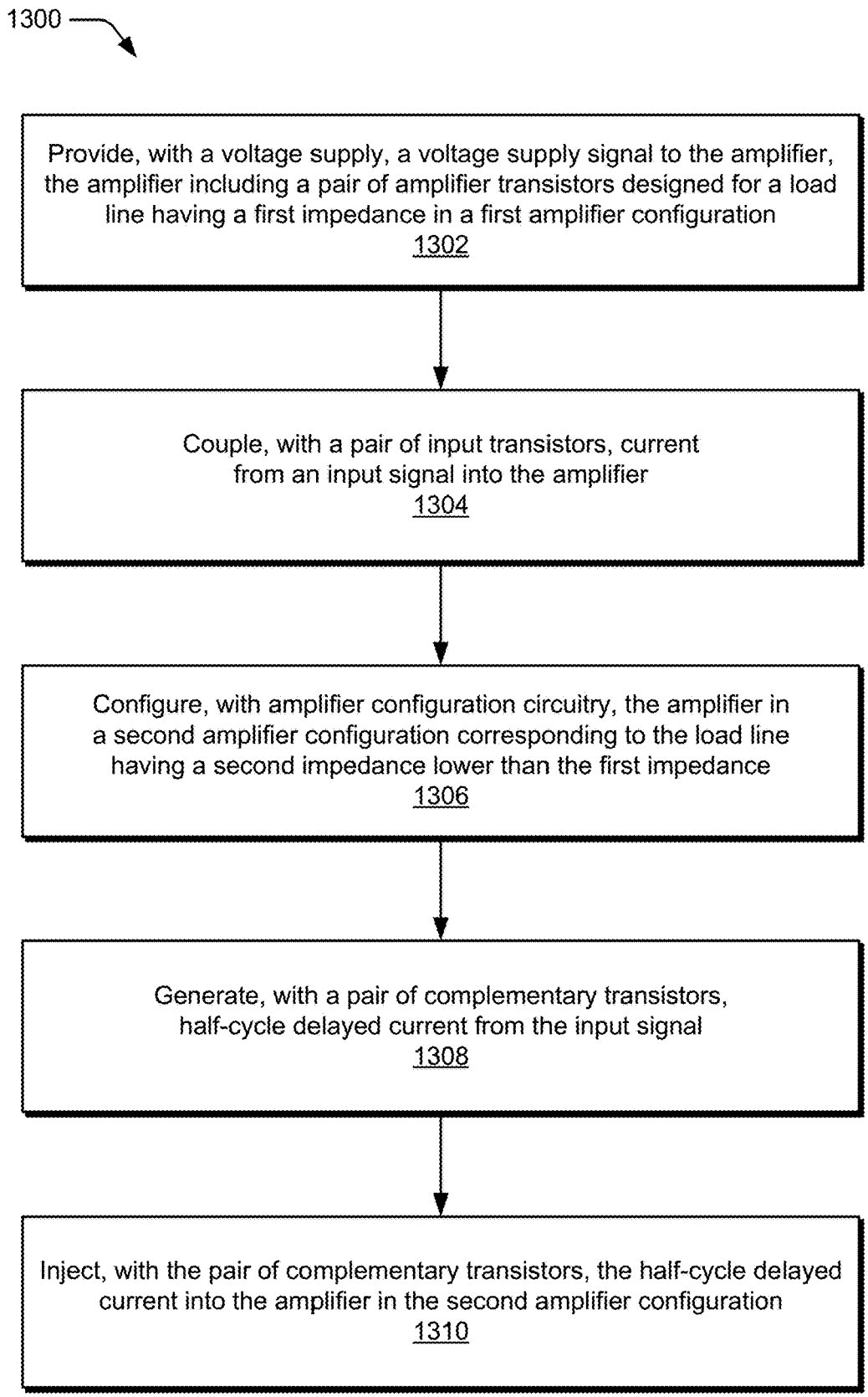
FIG. 13 is a flow diagram depicting an example procedure in accordance with one or more aspects of the disclosure.

FIG. 13 illustrates an example procedure 1300 for configuring an amplifier in accordance with one or more aspects of the disclosure. Aspects of the procedure may be implemented in hardware, firmware, software, or a combination thereof. The procedure is shown as a set of blocks that specify operations performed by one or more devices or components thereof and are not necessarily limited to the orders shown for performing the operations by the respective blocks. In at least some aspects, the procedure may be performed by a suitably configured device or devices, such as the computing device 102 in FIG. 1, or any device including an amplifier, such as the example amplifier circuits in FIGS. 2-11.

A voltage supply provides a voltage supply signal to the amplifier (block 1302). The amplifier includes a pair of amplifier transistors designed for a load line having a first impedance in a first amplifier configuration.

A pair of input transistors couple current from an input signal into the amplifier (block 1304). The input signal has multiple signal phases, such as a differential signal with two signal phases.

Amplifier configuration circuitry 610, under control of amplifier configuration control circuitry 602, configures the amplifier in a second amplifier configuration corresponding to the load line having a second impedance that is lower than the first impedance (block 1306). In one example, the first impedance is four or eight times greater than the second impedance. The amplifier may include no switched inductors or switched capacitors to change from the first to the second amplifier configuration. In operation, the amplifier is configured to amplify the input signal in the second amplifier configuration with the load line having the first impedance.

In one example, the amplifier configuration circuitry disables one transistor of the pair of input transistors and an additional transistor of the pair of amplifier transistors. The amplifier configuration circuitry also reconfigures current flow in the amplifier by preventing current flow to the disabled transistors.

A pair of complementary transistors generates half-cycle delayed current from the input signal (block 1308). The amplifier configuration circuitry can configure the amplifier in the second amplifier configuration by enabling the pair of complementary transistors. The complementary transistors are of a complementary transistor type to the amplifier transistors. Further, respective complementary transistors have respective first terminals coupled to the voltage supply signal and respective second terminals coupled to respective first terminals of respective amplifier transistors. In one example, the pair of complementary transistors are connected to a pair of transistor switches configurable to selectively connect and disconnect the pair of complementary transistors to and from the amplifier transistors.

The pair of complementary transistors injects the half-cycle delayed current into the amplifier in the second amplifier configuration (block 1310). The pair of complementary transistors increases current in the amplifier by injecting the half-cycle delayed current into the amplifier, without increasing an amount of current provided by the voltage supply signal to the amplifier.

The amplifier configuration circuitry can also configure the amplifier in a third amplifier configuration corresponding to the load line having a third impedance that is lower than the first impedance. The third amplifier configuration disables one of the amplifier transistors and one of the complementary transistors.

Accordingly, the methods described herein can save power without including an output matching network or other electromagnetic (EM) hardware to modulate the impedance of a load line in an amplifier. Power can be conserved because the complementary transistors and the devices of the amplifier configuration circuitry that are included in accordance with the disclosed methods consume relatively little power and do not need to change the implemented impedance of the load line. The methods described herein modulate the effective impedance of the load line by reconfiguring current in the amplifier so that the "expected" load line impedance in the modified amplifier configuration is less than the actual load line impedance implemented in the amplifier. Thus, the methods described herein are well-suited for implementations in mobile devices that place a premium on small size and low power consumption because power can be conserved without adding an output matching network or other costly hardware to modulate the impedance of a load line in an amplifier.

FIG. 14 is a flow diagram depicting an example procedure 1400 in accordance with one or more aspects of the disclosure. The procedure 1400 is described in the form of a set of blocks 1402-1408 that specify operations that can be performed. However, operations are not necessarily limited to the order shown in FIG. 14 or described herein, for the operations may be implemented in alternative orders or in fully or partially overlapping manners. Also, fewer, more, and/or different operations may be implemented to perform the procedure 1400, or an alternative procedure. Operations represented by the illustrated blocks of the procedure 1400 may be performed by an amplifier circuit 604 and/or amplifier configuration control circuitry 602. More specifically, at least some of the operations of the procedure 1400 may be performed by or using amplifier configuration circuitry 610.

At block 1402, an inductor power switch is configured that selectively couples an inter-inductor node of at least one inductor to a supply voltage. For example, amplifier configuration control circuitry 602 can configure an inductor power switch 736 that selectively couples an inter-inductor node 734 of at least one inductor 738 to a supply voltage (e.g., V1, V2, or V3). For instance, a switch that is coupled to a power rail may be opened or closed by turning at least one transistor off or on, respectively. Further, multiple transistors may be turned on or off to select between two or more (e.g., three) different supply voltages, including turning each of the multiple transistors off to select no supply voltage.

At block 1404, a power switch is configured that selectively couples at least one amplifier node to another supply voltage, with the at least one amplifier node disposed between the at least one inductor and at least one amplifier transistor. For example, the amplifier configuration control circuitry 602 can configure a power switch 730 (e.g., a plus power switch 730-P or a minus power switch 730-M) that selectively couples at least one amplifier node 702 or 704 (e.g., a plus amplifier node 702 or a minus amplifier node 704) to another supply voltage (e.g., V1, V2, or V3). The at least one amplifier node 702 or 704 is disposed between the at least one inductor 738 and at least one amplifier transistor 206 or 208. The amplifier transistor may be part of a plus array of transistors 752 or a minus array of transistors 754. The one or more supply voltages to which the inductor power switch 736 provides access may be the same as or different from those to which the power switch 730 provides access.

At block 1406, an amplifier is operated in a first amplifier configuration in which the inductor power switch connects the inter-inductor node to the supply voltage having a second supply voltage level and the power switch is disconnected from the other supply voltage. For example, the amplifier configuration control circuitry 602 can operate an amplifier (e.g., a differential amplifier 104 including an amplifier circuit 604) in a first amplifier configuration 200 (e.g., corresponding to amplifier circuit 604-1) in which the inductor power switch 736 connects the inter-inductor node 734 to the supply voltage (e.g., V1, V2, or V3) having a second supply voltage level (e.g., V2=$V_{DD}$) and the power switch 730 (e.g., a plus power switch 730-P or a minus power switch 730-M) is disconnected from the other supply voltage (e.g., V1, V2, or V3). To operate in accordance with the first amplifier configuration 200, the amplifier configuration control circuitry 602 may control other components, such as plus transistor switch 762 or a minus transistor switch 764 to enable multiple transistors of arrays of transistors and/or a plus switch 406 or a minus switch 408 to deactivate at least one complementary transistor 402 or 404.

At block 1408, the amplifier is operated in a second amplifier configuration in which the inductor power switch is disconnected from the supply voltage and the power switch connects the at least one amplifier node to the other supply voltage having the second supply voltage level. For example, the amplifier configuration control circuitry 602 can operate the amplifier (e.g., a differential amplifier 104 including an amplifier circuit 604) in a second amplifier configuration 300 (e.g., corresponding to amplifier circuit 604-2) in which the inductor power switch 736 is disconnected from the supply voltage (e.g., V1, V2, or V3) and the power switch 730 (e.g., a plus power switch 730-P or a minus power switch 730-M) connects the at least one amplifier node 702 or 704 to the other supply voltage (e.g., V1, V2, or V3) having the second supply voltage level (e.g., V2=$V_{DD}$). The amplifier configuration control circuitry 602 may also operate the amplifier in other amplifier configurations, such as the third and fourth amplifier configurations 400 and 500 (e.g., corresponding to amplifier circuits 604-3 and 604-4, respectively), as described above.

Having considered a discussion of example methods for operating and configuring an amplifier, consider now a discussion of a device on which aspects of reconfiguring amplifiers for load line enhancement can be implemented.

Figure 15:
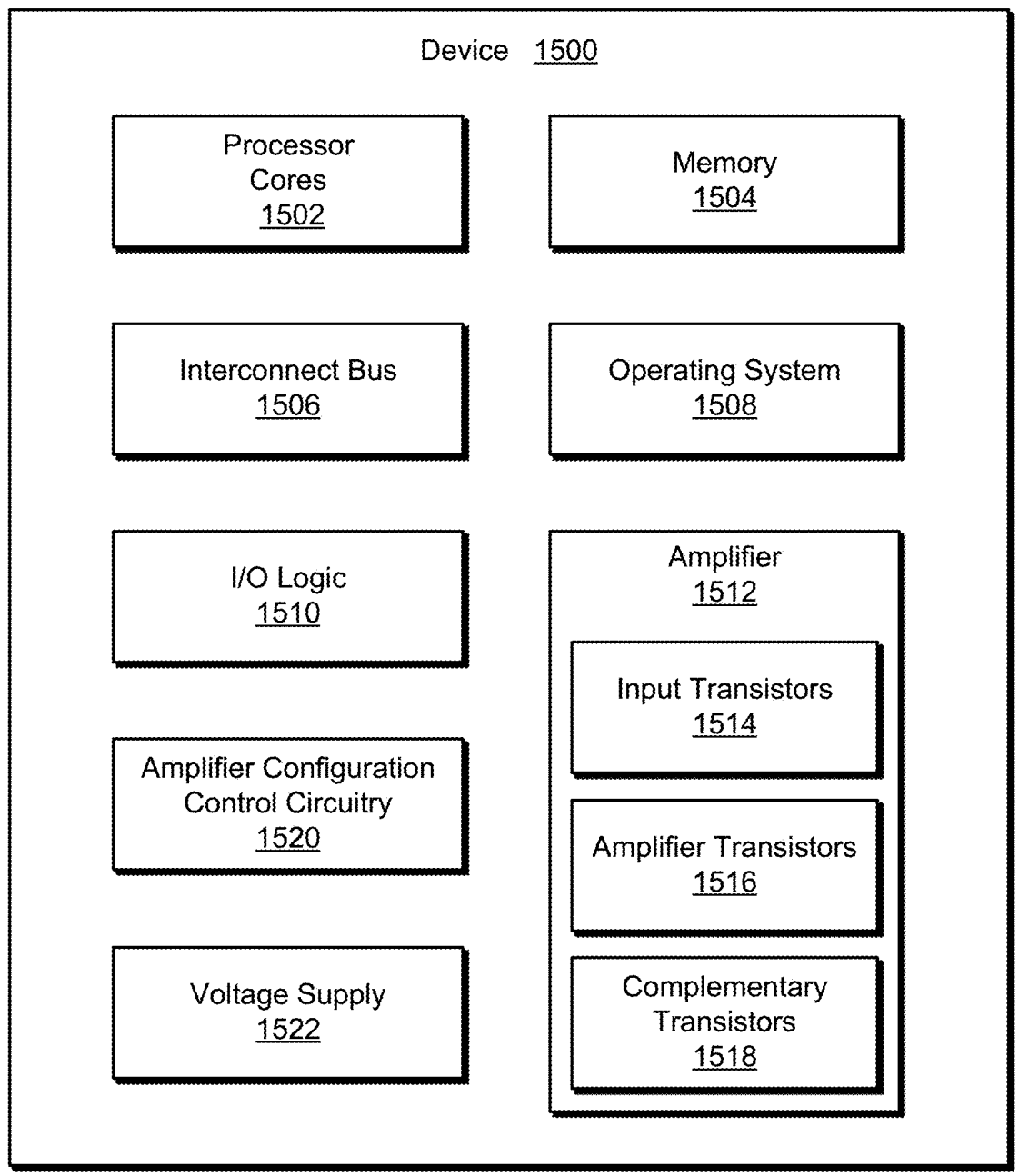
FIG. 15 illustrates an example electronic device that can be employed for one or more implementations described herein.

FIG. 15 illustrates an example device 1500 which includes components capable of implementing aspects of reconfiguring amplifiers for load line enhancement. The device 1500 may be implemented as, or in, any suitable electronic device, such as a modem, broadband router, access point, cellular phone, smart-phone, tablet, gaming device, laptop computer, desk top computer, net book, set-top-box, smart-phone, network-attached storage (NAS) device, cell tower, satellite, cable head-end, work station, testing station, server, test and measurement equipment, combinations thereof, and/or any other device including at least one amplifier. The device 1500 can comprise one or more devices, but it is illustrated as a single device in FIG. 15 for simplicity. For instance, the device 1500 may be implemented on multiple devices connected over a network.

The device 1500 may be integrated with a microprocessor, storage media, I/O logic, data interfaces, logic gates, a transmitter, a receiver, circuitry, firmware, software, and/or combinations thereof to provide communicative or processing functionalities. The device 1500 may include a data bus (e.g., cross bar or interconnect fabric) enabling communication between the various components of the device. In some aspects, components of the device 1500 may interact via the data bus to implement aspects of reconfiguring amplifiers for load line enhancement.

In this particular example, the device 1500 includes processor cores 1502 and memory 1504. The memory 1504 may include any suitable type of memory, such as volatile memory (e.g., DRAM), non-volatile memory (e.g., flash), cache, and the like. In the context of this disclosure, the memory 1504 is implemented as a storage medium, and does not include transitory propagating signals or carrier waves. An interconnect bus 1506 is used to allow components of the device 1500 to interact, such as to access the memory 1504. The memory 1504 can store data and processor-executable instructions of the device 1500, such as operating system 1508 and other applications. The processor cores 1502 may execute the operating system 1508 and other applications from the memory 1504 to implement functions of the device 1500, the data of which may be stored to the memory 1504 for future access. The device 1500 may also include I/O logic 1510, which can be configured to provide a variety of I/O ports or data interfaces for communication.

The device 1500 also includes amplifier 1512. The differential amplifier 104 in FIG. 1 that is configurable into the example amplifier configurations 200, 300, 400, and 500, and 604 in FIGS. 2, 3, 4, 5 and 7/8/9/10/11, respectively, are examples of the amplifier 1512. The amplifier 1512 can be any suitable type of amplifier capable of implementing aspects of reconfiguring amplifiers for load line enhancement. Accordingly, the amplifier 1512 is not limited to being a differential amplifier, but can implement any suitable number of phases, such as 2, 4, or 8.

The amplifier 1512 includes input transistors 1514, amplifier transistors 1516, and complementary transistors 1518.

The input transistors 202 and 204 in FIGS. 2-5 and 7-11 are examples of the input transistors 1514. The amplifier transistors 206 and 208 in FIGS. 2-5 and 7-11 are examples of the amplifier transistors 1516. The complementary transistors 402 and 404 in FIGS. 2-5 and 7-11 are examples of the complementary transistors 1518.

The device 1500 also includes amplifier configuration circuit 1520. The amplifier configuration control circuitry 1520 can include any suitable type of circuitry for reconfiguring the amplifier 1512, such as reconfiguring from a first amplifier configuration in which the impedance of the load line of the amplifier is designed and built, to a second amplifier configuration in which the expected or desired impedance of the amplifier is less than the actual impedance of the load line as implemented. The amplifier configuration control circuitry 602 is an example of the amplifier configuration control circuitry 1520. The amplifier 1512 also includes circuitry for biasing transistors to selectively enable and disable the transistors, as described above.

The device 1500 also include voltage supply 1522. The voltage supply 1522 can comprise any suitable type of circuit that supplies a voltage supply signal to the amplifier 1512. The voltage supply 1522 can therefore provide any suitable voltage supply signals to the amplifier 1512, such as the voltage supply signal $V_{DD}$ and the control voltage $V_c$ in FIGS. 2-5 and 7-11, and the bias voltage $0.5 \cdot V_{DD}$ in FIGS. 4 and 5. Further, the voltage supply 1522 can provide, under control of the amplifier configuration control circuitry 1520, bias voltages to the amplifier configuration circuit 1520, such as bias voltages to enable and disable transistor switches of the amplifier configuration circuitry 610 (e.g., of FIG. 6).

In one example, the amplifier 1512, the amplifier configuration control circuitry 1520, and the voltage supply 1522 are embodied on a System-on-Chip (SoC), such as an application-specific integrated circuit (ASIC) or programmable logic device (e.g., a field-programmable gate array (FPGA)).

In one or more example aspects of the disclosure, the functions described may be implemented in hardware, software, firmware, or any combination thereof. If implemented in software, functions may be stored on a computer-readable storage medium (CRM). In the context of this disclosure, a computer-readable storage medium may be any available medium that can be accessed by a general-purpose or special-purpose computer that does not include transitory propagating signals or carrier waves. By way of example, and not limitation, such media can comprise RAM, ROM, EEPROM, CD-ROM or other optical disk storage, magnetic disk storage, or other magnetic storage devices, or any other non-transitory medium that can be used to carry or store information that can be accessed by a general-purpose or special-purpose computer, or a general-purpose or special-purpose processor. The information can include any suitable type of data, such as computer-readable instructions, sampled signal values, data structures, program components, or other data. These examples, and any combination of storage media and/or memory devices, are intended to fit within the scope of non-transitory computer-readable media. Disk and disc, as used herein, includes compact disc (CD), laser disc, optical disc, digital versatile disc (DVD), and Blu-ray disc where disks usually reproduce data magnetically, while discs reproduce data optically with a laser. Combinations of the above should also be included within the scope of computer-readable media.

Firmware components include electronic components with programmable memory configured to store executable instructions that direct the electronic component how to operate. In some cases, the executable instructions stored on the electronic component are permanent, while in other cases, the executable instructions can be updated and/or altered. At times, firmware components can be used in combination with hardware components and/or software components.

The terms "component" and "system" are indented to refer to one or more computer related entities, such as hardware, firmware, software, or any combination thereof, as further described above. For example, a component may refer to various electronic and/or hardware entities, such as a circuit or a device thereof.

Certain specific aspects are described above for instructional purposes. The teachings of this disclosure have general applicability, however, and are not limited to the specific aspects described above.

What is claimed is:

1. An apparatus comprising:
   an amplifier including:
   at least one plus transistor stack coupled to a plus amplifier node and a plus input node, wherein the at least one plus transistor stack includes a plus transistor switch configured to enable or disable the plus transistor stack;
   at least one minus transistor stack coupled to a minus amplifier node and a minus input node;
   at least one inductor coupled between the plus amplifier node and the minus amplifier node, the at least one inductor including an inter-inductor node;
   a minus power switch coupled between the minus amplifier node and one or more supply voltages; and
   an inductor power switch coupled between the inter-inductor node and at least one supply voltage.

2. The apparatus of claim 1, wherein:
   the at least one plus transistor stack further includes a plus input transistor coupled in series with a plus amplifier transistor; and
   the at least one minus transistor stack includes a minus input transistor coupled in series with a minus amplifier transistor.

3. The apparatus of claim 1, wherein:
   the at least one minus transistor stack includes a minus transistor switch configured to enable or disable the minus transistor stack.

4. The apparatus of claim 1, wherein:
   the at least one inductor comprises a plus inductor and a minus inductor coupled together in series between the plus amplifier node and the minus amplifier node; and
   the inter-inductor node is disposed between the plus inductor and the minus inductor.

5. The apparatus of claim 1, wherein the amplifier further comprises:
   a plus power switch coupled between the plus amplifier node and the one or more supply voltages.

6. The apparatus of claim 1, wherein:
   the inductor power switch is configured to connect the inter-inductor node to the at least one supply voltage or to disconnect the inter-inductor node from the at least one supply voltage.

7. The apparatus of claim 6, wherein:
   the inductor power switch is configured to disconnect the inter-inductor node from the at least one supply voltage and enable a voltage of the inter-inductor node to fluctuate.

8. The apparatus of claim 1, wherein the amplifier further comprises:

a minus complementary transistor coupled between the minus amplifier node and the minus input node.

9. The apparatus of claim 8, wherein the amplifier further comprises:
a minus switch coupled between the minus complementary transistor and the at least one minus transistor stack at the minus amplifier node.

10. The apparatus of claim 9, wherein the amplifier further comprises:
a plus complementary transistor coupled between the plus amplifier node and the plus input node; and
a plus switch coupled between the plus complementary transistor and the at least one plus transistor stack at the plus amplifier node.

11. The apparatus of claim 1, wherein:
the inductor power switch is coupled between the inter-inductor node and multiple supply voltages; and
the inductor power switch is configured to connect the inter-inductor node to at least one of the multiple supply voltages or to none of the multiple supply voltages.

12. The apparatus of claim 1, wherein:
the minus power switch is configured to connect the minus amplifier node to at least one of the one or more supply voltages or to none of the one or more supply voltages.

13. The apparatus of claim 1, wherein the amplifier further comprises:
a plus array of transistors coupled to the plus amplifier node and the plus input node, the plus array of transistors comprising multiple plus transistor stacks, including the at least one plus transistor stack; and
a minus array of transistors coupled to the minus amplifier node and the minus input node, the minus array of transistors comprising multiple minus transistor stacks, including the at least one minus transistor stack.

14. The apparatus of claim 13, wherein the amplifier further comprises:
a bias voltage switch coupled between (i) the plus array of transistors and the minus array of transistors and (ii) multiple supply voltages,
wherein the bias voltage switch is coupled to multiple gates of multiple plus amplifier transistors of the multiple plus transistor stacks and to multiple gates of multiple minus amplifier transistors of the multiple minus transistor stacks.

15. The apparatus of claim 1, further comprising:
a wireless interface including a power amplifier, wherein:
the amplifier comprises a driver amplifier; and
the driver amplifier is coupled to the power amplifier.

16. A system for load-line enhancement using amplifier reconfiguration, the system comprising:
an amplifier including:
a plus array of transistors coupled to a plus amplifier node and a plus input node, the plus array of transistors including multiple plus transistor stacks;
a minus array of transistors coupled to a minus amplifier node and a minus input node, the minus array of transistors including multiple minus transistor stacks;
at least one inductor coupled between the plus amplifier node and the minus amplifier node, the at least one inductor including an inter-inductor node; and
configuration means for configuring the amplifier into different amplifier configurations, wherein the configuration means comprises switch means for selectively coupling the inter-inductor node to a supply voltage; and
control means for controlling the configuration means to adjust an effective impedance of a load line of the amplifier, wherein the control means is coupled to the configuration means.

17. The system of claim 16, wherein the configuration means further comprises:
switch means for selectively coupling at least one of the plus amplifier node or the minus amplifier node to the supply voltage.

18. The system of claim 16, further comprising:
at least one complementary transistor coupled to at least one of the plus array of transistors or the minus array of transistors,
wherein the configuration means further comprises switch means for selectively connecting and disconnecting the at least one complementary transistor to or from the at least one of the plus array of transistors or the minus array of transistors.

19. A method for amplifier configuration for load-line enhancement, the method comprising:
configuring an inductor power switch that selectively couples an inter-inductor node of at least one inductor to a supply voltage;
configuring a power switch that selectively couples at least one amplifier node to another supply voltage, wherein the at least one amplifier node is disposed between the at least one inductor and at least one amplifier transistor;
configuring a transistor switch to selectively enable or disable the at least one amplifier transistor;
operating an amplifier in a first amplifier configuration in which the inductor power switch connects the inter-inductor node to the supply voltage having a second supply voltage level and the power switch is disconnected from the other supply voltage; and
operating the amplifier in a second amplifier configuration in which the inductor power switch is disconnected from the supply voltage and the power switch connects the at least one amplifier node to the other supply voltage having the second supply voltage level.

20. The method of claim 19, wherein:
the amplifier comprises a differential amplifier; and
the operating the amplifier in the second amplifier configuration comprises operating the differential amplifier in a single-ended mode in the second amplifier configuration in which the transistor switch disables the at least one amplifier transistor.

21. The method of claim 19, further comprising:
configuring at least one of a plus switch or a minus switch that selectively couples a complementary transistor to the at least one amplifier node; and
operating the amplifier in a third amplifier configuration in which:
the inductor power switch connects the inter-inductor node to the supply voltage having a first supply voltage level, wherein the first supply voltage level is less than the second supply voltage level;
the power switch is disconnected from the other supply voltage; and
the at least one of the plus switch or the minus switch is closed to connect the complementary transistor to the at least one amplifier node.

22. The method of claim 21, wherein:
the amplifier comprises an array of transistors, including the at least one amplifier transistor;
the operating the amplifier in the first amplifier configuration comprises operating the amplifier using a first quantity of transistors of the array of transistors; and
the operating the amplifier in the third amplifier configuration comprises operating the amplifier using a second quantity of transistors of the array of transistors, wherein the second quantity is less than the first quantity.

23. The method of claim 21, wherein:
the operating the amplifier in the first amplifier configuration comprises operating the amplifier in the first amplifier configuration in which the at least one of the plus switch or the minus switch is opened to disconnect the complementary transistor from the at least one amplifier node; and
the operating the amplifier in the second amplifier configuration comprises operating the amplifier in the second amplifier configuration in which the at least one of the plus switch or the minus switch is opened to disconnect the complementary transistor from the at least one amplifier node.

24. The method of claim 21, wherein the operating the amplifier in the third amplifier configuration comprises injecting half-cycle-delayed current into the amplifier using the complementary transistor.

25. The method of claim 21, further comprising:
operating the amplifier in a fourth amplifier configuration in which:
the inductor power switch is disconnected from the supply voltage;
the power switch connects the at least one amplifier node to the other supply voltage having the first supply voltage level, wherein the first supply voltage level is less than the second supply voltage level; and
the at least one of the plus switch or the minus switch is closed to connect the complementary transistor to the at least one amplifier node.

26. The method of claim 25, wherein:
the amplifier comprises an array of transistors;
the operating the amplifier in the first amplifier configuration comprises operating the amplifier using a first quantity of transistors of the array of transistors;
the operating the amplifier in the second amplifier configuration comprises operating the amplifier using a second quantity of transistors of the array of transistors, wherein the second quantity is lower than the first quantity;
the operating the amplifier in the third amplifier configuration comprises operating the amplifier using a third quantity of transistors of the array of transistors, wherein the third quantity is lower than the second quantity; and
the operating the amplifier in the fourth amplifier configuration comprises operating the amplifier using a fourth quantity of transistors of the array of transistors, wherein the fourth quantity is lower than the third quantity.

27. An apparatus comprising:
a differential amplifier including:
a pair of input transistors coupled to an equipotential node, wherein the pair of input transistors is configured to receive a differential input signal;
a pair of amplifier transistors respectively coupled in series with the pair of input transistors, wherein the pair of amplifier transistors is configured to amplify the differential input signal, the pair of amplifier transistors having a load line with a first impedance in conjunction with the pair of input transistors in accordance with a first amplifier configuration;
amplifier configuration circuitry coupled to the pair of amplifier transistors; and
amplifier configuration control circuitry coupled to the amplifier configuration circuitry, wherein the amplifier configuration control circuitry is configured to use the amplifier configuration circuitry to institute one or more other amplifier configurations that respectively correspond to the load line of the pair of amplifier transistors having one or more other impedances by reconfiguring current flow in the differential amplifier, and wherein the amplifier configuration control circuitry is further configured to disable one transistor of the pair of input transistors and an additional transistor of the pair of amplifier transistors.

28. The apparatus of claim 27, wherein:
the differential amplifier further includes a pair of complementary transistors respectively coupled in series with the pair of amplifier transistors;
the amplifier configuration control circuitry is further configured to institute the one or more other amplifier configurations using the pair of complementary transistors; and
the pair of complementary transistors is configured to reconfigure the current flow in the differential amplifier by injecting into the differential amplifier current that is delayed by a half cycle.

29. The apparatus of claim 27, wherein the amplifier configuration control circuitry is further configured to:
reconfigure the current flow in the differential amplifier by preventing the current flow through the one transistor and the additional transistor.

* * * * *